(12) United States Patent
Nakamura et al.

(10) Patent No.: US 9,017,930 B2
(45) Date of Patent: Apr. 28, 2015

(54) PATTERN FORMATION METHOD AND GUIDE PATTERN MATERIAL

(71) Applicants: Hiroko Nakamura, Kanagawa-ken (JP);
Satoshi Mikoshiba, Kanagawa-ken (JP);
Atsushi Hieno, Kanagawa-ken (JP);
Shigeki Hattori, Kanagawa-ken (JP)

(72) Inventors: Hiroko Nakamura, Kanagawa-ken (JP);
Satoshi Mikoshiba, Kanagawa-ken (JP);
Atsushi Hieno, Kanagawa-ken (JP);
Shigeki Hattori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/623,237

(22) Filed: Sep. 20, 2012

(65) Prior Publication Data
US 2013/0183828 A1 Jul. 18, 2013

(30) Foreign Application Priority Data
Sep. 26, 2011 (JP) ................................. 2011-208745

(51) Int. Cl.
| G03F 7/26 | (2006.01) |
| G03F 7/40 | (2006.01) |
| H01L 21/308 | (2006.01) |
| H01L 21/027 | (2006.01) |
| H01L 21/033 | (2006.01) |
| H01L 21/3213 | (2006.01) |

(52) U.S. Cl.
CPC ........... *G03F 7/40* (2013.01); *Y10T 428/24802* (2015.01); *G03F 7/26* (2013.01); *H01L 21/308* (2013.01); *H01L 21/0276* (2013.01); *H01L 21/0337* (2013.01); *H01L 21/32139* (2013.01)

(58) Field of Classification Search
CPC ......................................................... G03F 7/26
USPC .................................................... 430/311, 313
See application file for complete search history.

(56) References Cited

U.S. PATENT DOCUMENTS

| 6,313,233 B1 * | 11/2001 | Kurosawa et al. ............ 525/431 |
| 7,521,090 B1 | 4/2009 | Cheng et al. |
| 2009/0179002 A1 | 7/2009 | Cheng et al. |
| 2009/0309221 A1 * | 12/2009 | Ozaki et al. ................... 257/741 |
| 2011/0147983 A1 * | 6/2011 | Cheng et al. .................. 264/220 |

OTHER PUBLICATIONS

Joy Y. Cheng et al., "Simple and Versatile Methods to Integrate Directed Self-Assembly with Optical Lithography Using a Polarity-Switched Photoresist", ACS Nano, vol. 4, No. 8, 2010, pp. 4815-4823.

(Continued)

*Primary Examiner* — Kathleen Duda
(74) *Attorney, Agent, or Firm* — Oblon, McClelland, Maier & Neustadt, L.L.P.

(57) ABSTRACT

According to one embodiment, a pattern formation method includes forming a pattern on a layer. The layer has a first surface energy and includes a silicon compound. The pattern has a second surface energy different from the first surface energy. The method includes forming a block polymer on the layer and the pattern. The method includes forming a structure selected from a lamellar structure and a cylindrical structure of the block polymer containing polymers arranged by microphase separation. The lamellar structure is oriented perpendicularly to the layer surface. The cylindrical structure is oriented so as to have an axis parallel to a normal line of the layer surface. The second surface energy is not less than a maximum value of surface energies of the polymers or not more than a minimum value of the surface energies of the polymers.

17 Claims, 12 Drawing Sheets

(56) References Cited

OTHER PUBLICATIONS

Yasuhiko Sato et al., "Pattern Transfer Process Using Spun-on Carbon Film for KrF and ArF Lithography", Journal of Photopolymer Science and Technology, vol. 14, No. 3, 2001, 5 Pages.

Sang Ouk Kim et al., "Epitaxial Self-Assembly of Block Copolymers on Lithographically Defined Nanopatterned Substrates", Nature, vol. 424, Jul. 24, 2003, pp. 411-414.

Joy Y. Cheng et al., "Dense Self-Assembly on Sparse Chemical Patterns: Rectifying and Multiplying Lithographic Patterns Using Block Copolymers", Advanced Materials, vol. 20, 2008, pp. 3155-3158.

* cited by examiner

PATTERN FORMATION METHOD AND GUIDE PATTERN MATERIAL

CROSS-REFERENCE TO RELATED APPLICATIONS

This application is based upon and claims the benefit of priority from the prior Japanese Patent Application No. 2011-208745, filed on Sep. 26, 2011; the entire contents of which are incorporated herein by reference.

FIELD

Embodiments described herein relate generally to a pattern formation method and a guide pattern material.

BACKGROUND

Fine patterns in various electronic devices such as semiconductor devices are formed by, for example, lithography technology. As a new technology for coping with future miniaturization of patterns, there is a method utilizing microphase separation of a block polymer in which multiple kinds of polymer blocks are bonded and the pattern after microphase separation is used to as an etching mask. In this method, it is important to arrange the microphase-separated the block polymer with a desired orientation in a desired position. Furthermore, it is important to use at least one polymer block of the microphase-separated block polymer as a mask to process a film to be processed.

DETAILED DESCRIPTION

Figure 1A:
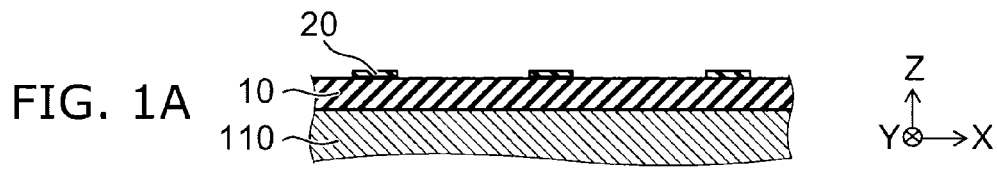
FIG. 1A and FIG. 1B are schematic cross-sectional views illustrating a pattern formation method according to an embodiment.

According to one embodiment, a pattern formation method is disclosed. The method includes forming a pattern on a layer. The layer has a first surface energy and includes a silicon compound. The pattern has a second surface energy different from the first surface energy. The method includes forming a block polymer on the layer and the pattern. The method includes forming a structure selected from a lamellar structure and a cylindrical structure of the block polymer containing a plurality of kinds of polymers arranged by microphase separation. The lamellar structure is oriented perpendicularly to the layer surface on the layer. The cylindrical structure is oriented so as to have an axis parallel to a normal line of the layer surface of the layer on the layer. The second surface energy is not less than a maximum value of surface energies of the polymers contained by a block polymer or not more than a minimum value of the surface energies of the polymers contained by a block polymer.

Various embodiments will be described hereinafter with reference to the accompanying drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification of the application and the drawings, components similar to those described in regard to a drawing thereinabove are marked with the same reference numerals, and a detailed description is omitted as appropriate.

Here, first, a block polymer is composed of structures (blocks), in each of which the same kind of plural monomers is continuously bonded. The blocks are chemically bonded. That is, the block polymer is a structure in which a plurality of kinds of polymers in a block form are chemically bonded. A fine periodic pattern is formed by microphase-separation caused by a repulsive force between polymers. The morphology (form) of the block pattern such as a lamellar structure and a cylindrical structure is determined by the composition of the blocks. For example, in the case of a block copolymer composed of two kinds of polymers (a first polymer and a second polymer), the lamellar structure is obtained when the ratios of the two polymers are approximately 50%, and the cylindrical structure is obtained when the ratio of one polymer is approximately 30%. The lamellar structure has an alternately stacked configuration in which the first polymer, the second polymer, the first polymer, the second polymer, . . . are alternately aligned. On the other hand, the cylindrical structure has a configuration in which the polymer of the lower ratio forms circular columns, which is periodically aligned, and the polymer of the higher ratio forms a matrix therearound.

In most cases without special treatment, a layered structure is formed in the case of the lamellar structure and cylinders are horizontally aligned in the case of the cylindrical structure. This is because the affinities of the polymers included in the block polymer to the substrate in contact with the block polymer are not the same between all the polymers. Therefore, a polymer with a high affinity to the substrate is formed on the substrate side. Hence, to make the lamella and the cylinder stand, it is necessary to use an orientation control layer having an almost equal affinity to the polymers constituting the block polymer.

Furthermore, when only microphase-separation is performed, a fingerprint-like pattern is obtained or various domains are formed. It is difficult to form a semiconductor pattern which contains regular patterns such as a line and space (L & S) pattern or a contact hole (C/H) pattern. Furthermore, it cannot be predetermined which polymer is arranged in a desired position. Therefore, a specific-polymer fixing pattern (a pinning layer pattern) for arranging a specific polymer of the block polymer regularly in a desired position is necessary.

A guide pattern includes an orientation control layer that controls the orientation of the block polymer mentioned above and a pinning layer pattern for regularly arranging a specific polymer in a desired position.

Examples of the guide pattern include a chemical guide and a physical guide (graphoepitaxy).

In the case of the chemical guide, a pinning layer having a high affinity only with one polymer is formed in order to regularly arrange a specific polymer in a desired position. In a region where the pinning layer is not formed, the orientation control layer for controlling the orientation of the block polymer is formed to control the orientation of the block polymer.

In the case of the physical guide, a structure body is formed. The affinity between the side wall of the structure body and the polymer is utilized to arrange polymers. In the case where the affinity between the side wall of the structure body and one polymer is high, the one polymer is sticked on the side wall. Starting from this, the block polymer is regularly arranged in the vertical direction of the side wall. The orientation control of the block polymer is carried out by forming the orientation control layer on the bottom surface of the structure body to control the orientation of the block polymer.

Figure 1B:
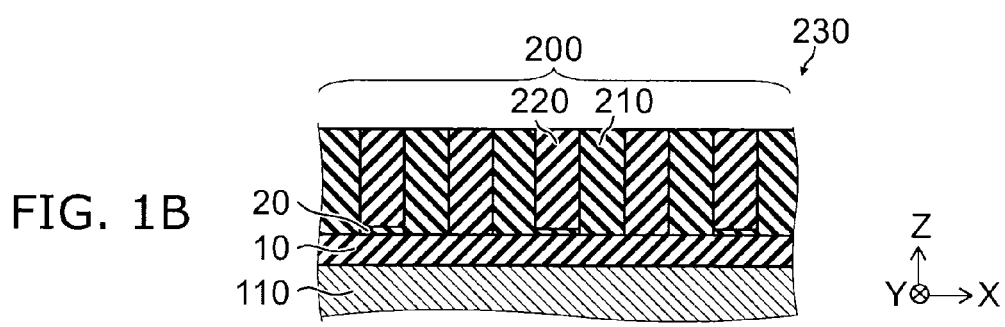

FIG. 1A and FIG. 1B are schematic cross-sectional views illustrating a pattern formation method according to an embodiment.

Figure 2A:
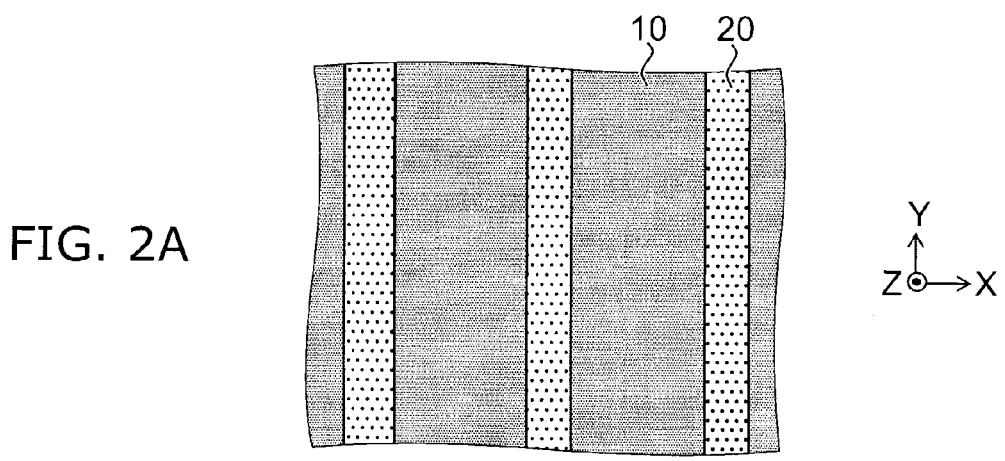
FIG. 2A and FIG. 2B are schematic plan views illustrating the pattern formation method according to the embodiment.
Figure 2B:
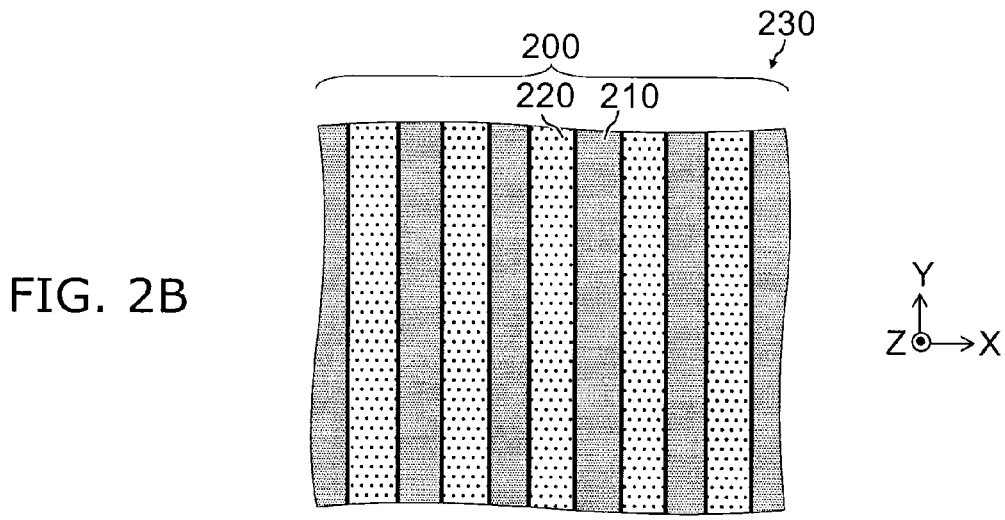

FIG. 2A and FIG. 2B are schematic plan views illustrating the pattern formation method according to the embodiment.

As shown in FIG. 1A, the pattern formation method according to the embodiment includes forming a pattern 20 that has a second surface energy different from the surface energy of a layer 10 on the layer 10 that has a first surface energy and includes a silicon compound (a first step). A film to be processed 110 is described in the embodiment described later.

Here, the layer 10 is the orientation control layer for orienting the block polymer. The second surface energy is not less than the maximum value of the surface energies of the plurality of polymers constituting the block polymer or not more than the minimum value of the surface energies of the plurality of polymers mentioned above.

The direction perpendicular to the major surface of the layer 10 is taken as the Z-axis direction. One direction perpendicular to the Z-axis direction is taken as the X-axis direction. The direction perpendicular to the Z-axis direction and the X-axis direction is taken as the Y-axis direction.

As shown in FIG. 2A, in this example, the pattern 20 having the second surface energy extends along the Y-axis direction. However, as described later, the shape of the pattern 20 having the second surface energy is arbitrary.

The pattern formation method further includes forming a block polymer 200 on the layer 10 and the pattern 20 having the second surface energy (a second step).

As shown in FIG. 1B, the pattern formation method further includes microphase-separation of the block polymer 200 to form a pattern of one of a lamellar structure 230 and a cylindrical structure including a plurality of polymers arranged (a third step). In this example, a pattern of the lamellar structure 230 is formed. The lamellar structure 230 includes a first polymer 210 and a second polymer 220.

As shown in FIG. 2B, the lamellar structure 230 has a structure in which the same kind of polymer is aligned along the Y-axis direction.

In the case of forming the lamellar structure 230, the orientation on the layer 10 is perpendicular to the layer surface of the layer 10. That is, the layer surface of the lamellar structure 230 (the interface between the first polymer 210 and the second polymer 220) is perpendicular to the X-axis.

As described later, in the case of forming the cylindrical structure, the orientation is produced so as to have an axis of the cylinder parallel to the normal line of the layer surface of the layer 10 mentioned above.

Thereby, the block polymer can be arranged by microphase-separation with a desired orientation in a desired position.

In the embodiment, a Si oxide film having an organic group in a side chain is formed on the film to be processed 110. The Si oxide film having an organic group in a side chain is an energy adjustment film for orienting the block polymer.

The embodiment relates to, for example, a lithography technology for forming a pattern of a semiconductor.

The embodiment is used for, for example, particularly a patterning technology in which the block polymer pattern is formed by microphase-separation, then part of the polymer blocks are removed, and only the desired polymer block is left for use as an etching mask.

By removing a certain polymer on a block basis from the lamellar structure or the cylindrical structure after microphase-separation, a L & S pattern or a C/H pattern can be formed.

In the case of the lamellar structure oriented so as to have a polymer interface perpendicular to the substrate surface, it forms a L & S pattern by removing one polymer on a block basis. In the case of the cylindrical structure having an axis of circular column parallel to the normal line of the substrate, it forms a C/H pattern by removing the polymer constituting the circular columnar portion on a block basis. The L & S pattern and the C/H pattern formed from the block polymer in this way serve as an etching mask that takes the place of the resist pattern.

To form a device pattern using one block of a di-block copolymer (BCP) (a structure in which two kinds of polymer blocks are bonded) as an etching mask, the film thickness of the BCP is too thin to etch the film to be processed. The BCP pattern is lost during the processing of the film to be processed 110. Hence, the BCP pattern is transferred to a film having a sufficient film thickness and high selectivity to the film to be processed 110, and the transferred pattern is used as a mask to etch the film to be processed.

In the case where the BCP is used as an etching mask, the orientation control layer to make the lamellar structure or the cylindrical structure stand is used as described above. There is also a structure in which etching and the orientation control to make the lamellar structure or the cylindrical structure stand are taken into consideration. In this configuration, a transfer layer, a low temp oxide/silicon hardmask, and an orientation control material (the orientation control layer) are disposed in this order from the lower side.

The chemical guide pattern to arrange block polymer regularly by microphase separation is formed, in most cases, by exposing a resist to extreme ultraviolet (EUV) light or an electron beam (EB) to form a resist pattern. Only the space portion of the resist pattern is etched with $O_2$ plasma or only the space portion is exposed to soft X-rays to modify the material, and the resist pattern is removed; thereby, a chemical guide pattern is formed. A fine pattern can be formed by EUV light or an electron beam. However, the method using EUV light is costly because the exposure apparatus using EUV light is expensive and the running cost is high. Also the method using an EB is costly because the exposure apparatus (drawing apparatus) using an EB is expensive and the drawing takes a long time which means low throughput.

In an ArF exposure apparatus, the apparatus cost and the running cost are less expensive than those in the EUV exposure apparatus. Furthermore, although the apparatus cost is slightly high as compared to the EB exposure apparatus, the processing speed is several tens of times higher. Therefore, when a resist pattern is formed using the ArF exposure apparatus, a guide pattern can be formed at lower cost than that when using the EUV light apparatus or the EB apparatus.

However, when a resist pattern is formed by the exposure of ArF light, a situation is different from that by the exposure with EUV light or an electron beam. Since the ArF resist has a high transmittance, the reflected light generated at the interface between the resist and the film to be processed affects the resist pattern. A background is added on the aerial image due to the reflection, and the contrast is decreased. Furthermore, at a certain thickness of the resist film, the light reflected from the interface between the resist film and the film to be processed are reflected at the upper surface of the resist film and a standing wave is undesirably produced. When a pattern is formed at the resolution limit of the ArF exposure apparatus, it is desired to avoid an increase in the level of the background and a standing wave. To this end, in the case of using ArF light, an anti-reflective film is formed between the film to be processed and the resist.

In the patterning of a resist, a tri-layer process is used in which an anti-reflective film also functioning as a pattern transfer film is formed under the resist film. In the tri-layer process, a structure is formed, in which a Si oxide film, an organic film (a carbon film; a C film), and a film to be processed are stacked under the resist. A resist pattern is transferred to the Si oxide film, the Si oxide film pattern is transferred to the organic film, and the organic film pattern is transferred to the film to be processed. The reflection from the interface between the organic film and the film to be processed is reduced by the organic film, and the film thickness of the Si oxide film is set so that the reflection at the interface between the organic film and the Si oxide film is canceled by the reflection at the interface between the Si oxide film and the resist. Thereby, the reflection is suppressed.

As described above, in the stacked structure of a pattern transfer layer and a low temp oxide/silicon hardmask in which etching and the orientation control of the block polymer are taken into consideration, the pattern transfer layer corresponds to the C film in the tri-layer process of a resist, the low temp oxide/silicon hardmask corresponds to the Si oxide film in the tri-layer process of a resist, and the orientation control material is the orientation control layer. In this case, if it is intended to perform patterning by optical lithography, the conditions for anti-reflection are set in the structure of the pattern transfer layer, the low temp oxide/silicon hardmask, the orientation control material, and resist.

Therefore, in this structure, the determination of the film thickness is complicated and the adjustment is difficult as compared to the tri-layer process of a resist. Furthermore, since one layer of the orientation control material is added, the number of processes is increased, which increases costs.

In other words, to form a chemical guide pattern inexpensively, it is effective to use a film having the functions of the orientation control layer, the anti-reflective film, and the pattern transfer film. However, under the present conditions, there is no film having these functions and it is necessary to add a new film, which increases costs.

As a method for forming a chemical guide pattern by optical lithography and etching, there is a method using a stacked-layered structure of a Si-containing bottom anti-reflective coating (Si-ARC) and a spin-on carbon layer in which the anti-reflection and etching are taken into consideration. However, in this case, the Si-ARC is the pinning layer, and the orientation control layer is formed conformally on a resist pattern or the Si-ARC after the resist pattern is formed and is insolubilized.

In the embodiment, the C film is formed on the film to be processed, and then the Si oxide film having an organic group in a side chain is formed. The Si oxide film having an organic group in a side chain is the surface energy adjustment film for orienting the block polymer. The film thicknesses of both are adjusted so that a stacked structure of the Si oxide film and the C film is the anti-reflective film. Furthermore, the Si oxide film and the C film have also the function to transfer the block polymer pattern to the film to be processed. Thereby, formation of a guide pattern used in the microphase-separation of the block polymer can also be that of the anti-reflective film and the pattern transfer film.

First Example

In this example, an example is described to form a guide pattern in which a Si oxide film is used as the orientation control layer.

Here, as the Si oxide film, a film is selected having the function of the orientation control layer that adjusts the surface energy of the block copolymer. Conventional Si oxide films have a high surface energy. For example, when the contact angle of water is used as an indicator of the surface energy, the contact angle of water to a conventional Si oxide film is 11 degrees. When polystyrene (PS)-poly(methyl methacrylate) (PMMA), which is a block copolymer (BCP), is taken as an example of the block polymer, the contact angle with water is 89 degrees in PS and 73 degrees in PMMA when the contact angle is measured under the same conditions. The surface energy decreases as the contact angle with water increases. Although the surface energy is greatly different between the Si oxide film and PMMA, PMMA is formed on the Si oxide film because PMMA has a greater affinity with the Si oxide film than PS has. In the case of the lamella, a layered structure is undesirably formed in which PMMA exists on the lower side and PS exists thereon. In the case of the cylinder, a wet layer of PMMA is formed and then cylinders are horizontally aligned. In other words, the conventional Si oxide film does not function as the orientation control layer. In view of this, in the embodiment, an organic group is introduced into a side chain of the Si oxide film to adjust the surface energy, and the film is used as the orientation control layer for the BCP.

An example of the method for adjusting the surface energy will now be illustrated using an SOG as an example. Tetramethoxysilane (TMOS, $Si(OMe)_4$) and methyltrimethoxysilane (MTMS, $MeSi(OMe)_3$) are cross-linked by hydrolysis and dehydration condensation with different ratios.

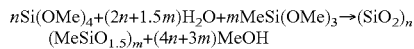

$$nSi(OMe)_4+(2n+1.5m)H_2O+mMeSi(OMe)_3 \rightarrow (SiO_2)_n (MeSiO_{1.5})_m+(4n+3m)MeOH$$

When the contact angle in this case is measured, the contact angle increases as the ratio of MTMS of a source material increases and changes in a range between 22 degrees and 89 degrees. In other words, the surface energy can be changed in accordance with the amount of organic groups introduced.

When the organic group of MTMS that is a source material is changed into organic groups with larger sizes, i.e., from a methyl group to an ethyl group (ethyltrimethoxysilane), a propyl group (propyltrimethoxysilane), and a phenyl group (phenyltrimethoxysilane), the contact angle of the SOG produced by hydrolysis and dehydration condensation increases and becomes 95 degrees in the case of a phenyl group. Thus, the surface energy can be changed also by changing the size of the organic group.

The cylinder and the lamella will stand in the case where the affinity of PS to the SOG is the same as that of PMMA to the SOG because the free energy of the entire system is smaller when PS and PMMA are alternately aligned in the horizontal direction (the lamella stands) than when PS and PMMA exist in a layered configuration. The cylindrical structure and the lamellar structure will stand when the free energy is decreased due to a decrease in the surface energy difference between the SOG and the polymers. In the case where no organic group is introduced, the affinity between the SOG and PMMA is high and the affinity between the SOG and PS is low; therefore, the BCP forms a layered lamellar structure. However, by introducing an organic group to adjust the surface energy, the surface energy of the SOG decreases, and the affinity between the SOG and PS and the affinity between the SOG and PMMA become same; thus, the structure of being alternately aligned in the horizontal direction (the lamella standing) becomes stable.

FIG. 3A to FIG. 3H are schematic cross-sectional views illustrating a pattern formation method according to the embodiment.

Figure 3A:
FIG. 3A to FIG. 3H are schematic cross-sectional views illustrating a pattern formation method according to the embodiment.

In this example, the case where W is used as the film to be processed 110 and an SOG is used as a Si oxide film 120 is taken as an example. The SOG according to the embodiment is formed on a W film (FIG. 3A). If an acid generator is added to the SOG beforehand, an acid is generated at the time of exposure with an electron beam, and the pinning layer is selectively formed. Therefore, an acid generator is preferably added.

Figure 3E:
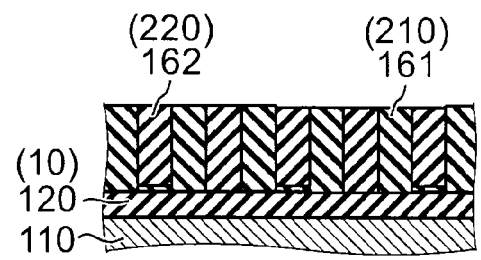
Figure 3B:
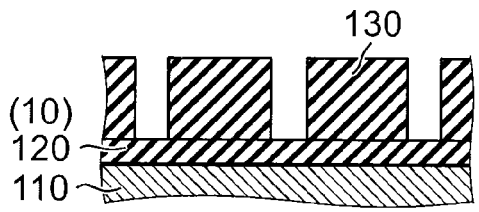

An electron beam resist 130 is applied thereonto and drawing is performed with an electron beam to form a resist pattern (FIG. 3B). The electron beam resist 130 is preferably a positive type in the case where an acid generator is added to the SOG. Forming the SOG reduces the proximity effect as well.

After that, a resin in which a cross-linkable resin and a cross-linker that are cross-linkable using an acid as a catalyst are dissolved in water or alcohol is applied onto the resist. The cross-linkable resin and the cross-linker are, for example, an amino resin. The amino resin is a urea resin such as tetramethylolurea, a melamine resin such as hexamethylolmelamine, a benzoguanamine resin, or the like. Since the amino resin is soluble in water or alcohol, the solution of the amino resin can be applied with little dissolution of the resist pattern. The silanol at the surface of the SOG and the methylol of the amino resin react together in the presence of an acid, and thereby a cross-linked resin is formed on the surface of the SOG film. In the case where a chemically amplified resist is used, the acid generated in the electron beam exposure serves as a catalyst of the cross-linking reaction. If an acid generator is added into the SOG, an acid is generated from the acid generator in the SOG in the drawing region in the case of a positive-tone resist.

Figure 3F:
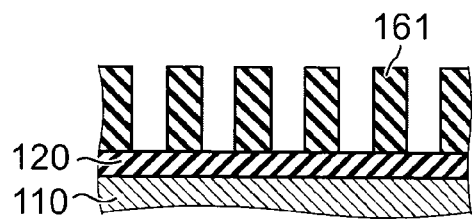
Figure 3C:
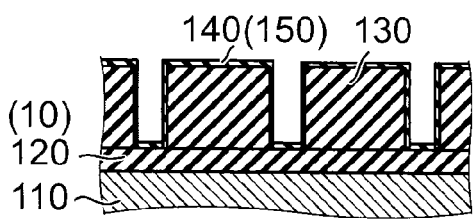

After that, the uncross-linked cross-linkable resin and cross-linker are removed by water or alcohol, and thereby such a cross-linked film 140 as is illustrated in FIG. 3C is formed on the surface of the Si oxide film 120. In the case of using a non-chemically amplified resist or even in the case of a chemically amplified resist, a cross-linked film may not be attached to the side surface of the resist when the acid generation amount in the side wall portion is small. The cross-linked film 140 forms a pinning layer 150.

After that, the resist is removed by a resist remover. At this time, although the cross-linked film attached to the side wall of the resist is removed together with the resist, the cross-linked film is not peeled off but remains because of its high surface energy. Thereby, the cross-linked film is formed as the pinning layer on the SOG orientation control layer. Thereby, such a chemical guide as is illustrated in FIG. 3D is formed.

If the affinity between one of the polymers constituting the BCP and the substrate surface, on which a polymer forms, is completely high as compared to that of the other of the polymers, only the one of the polymers constituting the BCP is formed on the substrate surface. The pattern having a high affinity only with one polymer is the pinning layer 150.

It is assumed that the BCP is composed of two kinds of polymers A and B and the surface energy of the polymer A is smaller. When the surface energy of the pinning layer 150 is not more than the surface energy of the polymer A, the affinity between the polymer A and the pinning layer 150 is high, and the polymer A is pinned on the pinning layer 150. On the other hand, when the surface energy of the pinning layer 150 is not less than the surface energy of the polymer B, the affinity between the polymer B and the pinning layer 150 is high, and the polymer B is pinned on the pinning layer 150.

Figure 3G:
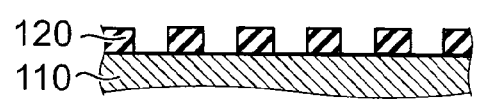
Figure 3D:
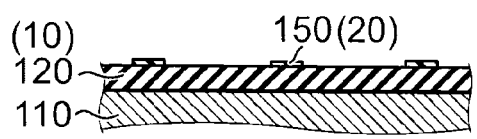

Next, a process is described in which a block polymer pattern oriented using the chemical guide pattern of FIG. 3D is used as an etching mask.

First, a block polymer is applied onto the chemical guide. For example, a block copolymer (BCP) of PS-b-PMMA with a molecular weight of 73000 and a PS volume fraction of 51% is applied and annealed at 200° C. for 24 hours. Thereby, a microphase-separation occurs, and PMMA, which has a high surface energy, is pinned on the pinning layer 150 formed of a cross-linked film. Furthermore, due to the SOG orientation control layer, PMMA and PS are alternately arranged in the horizontal direction. Consequently, a BCP pattern with a period of 44 nm (nanometers) like FIG. 3E is obtained. PMMA 162 and PS 161 are alternately arranged. In this case, since frequency doubling has been performed, a BCP with a period of half the guide pattern period has been arranged. The guide pattern period is not limited to twice the BCP period, and the guide pattern period needs only to be an integral multiple of the BCP period. The period after the microphase-separation of the BCP depends on the molecular weight, and the molecular weight may be appropriately selected in order to obtain desired dimensions.

After that, one block of the BCP is removed. For example, the PMMA 162 is removed by oxygen plasma, because of high etching selectivity of the PMMA 162 to the PS 161. Therefore, an L & S pattern formed of PS like FIG. 3F is obtained.

Figure 3H:

Next, the PS pattern is used as a mask to etch the SOG (the Si oxide film 120) using a fluorine-based gas (FIG. 3G). Finally, the SOG pattern formed is transferred to the W film (the film to be processed 110) using $Cl_2$ gas. Since the W film has a higher etching rate than the SOG and have a selectivity to the SOG, a pattern of the W film can be obtained by using the SOG as an etching mask (FIG. 3H).

The PS pattern has a film thickness of up to approximately 45 nm. If the film thickness is not less than this value, it is difficult to make the lamellar structure stand. An etching selectivity between W and PS, which is an organic film, cannot be obtained much; therefore, it is difficult to perform patterning on W using only the PS pattern. By transferring the PS pattern to the SOG and transferring the SOG pattern to W in the above way, a selectivity can be ensured and processing is possible even for PS with a thin film thickness.

Herein, a cross-linker and a cross-linkable resin that are soluble in alcohol or water and cross-linkable in the presence of an acid are used in order to form the pinning layer 150. In this method, since the alcohol or water that is the solvent of the cross-linkable resin solution hardly dissolves the resist, the resist does not need to be insolubilized, and the number of processes can be reduced.

In the method mentioned above, the SOG is the orientation control layer and also serves as the pattern transfer film. Since the SOG functions as the orientation control layer and the pattern transfer film, it is not necessary to form an orientation control film and a pattern transfer film separately, and the number of processes can be reduced.

Although W is used as the film to be processed herein, also poly-Si may be used. Since an etching selectivity between poly-Si and the SOG can be ensured by using HBr or $Cl_2$ as an etching gas, a poly-Si pattern is obtained using the BCP pattern. Moreover, a film made of any material that provides a selectivity with Si oxide allows processing using the Si oxide film 120 as a mask.

In the foregoing, the electron beam resist 130 is used and exposed to an electron beam to form a resist pattern. However, the means for forming a resist pattern is not limited thereto. Any material that can generate a developer-soluble portion and an insoluble portion by energy beam irradiation may be used as a resist. Furthermore, the energy beam is not limited to an electron beam, and EUV light, an ion beam, and a particle beam may be used.

Second Example

In this example, a method is described in which a resist pattern is formed on a Si orientation control layer by light exposure to form the pinning layer.

FIG. 4A to FIG. 4D are schematic cross-sectional views illustrating a pattern formation method according to the embodiment.

First, the configuration of a chemical guide pattern according to the embodiment is described with reference to FIG. 4D.

A C film 115 and the Si oxide film 120 are formed in this order on the film to be processed 110. The pinning layer pattern is formed thereon. The stacked structure of the Si oxide film 120/the C film 115 functions as the anti-reflective film and the pattern transfer film. Further, the Si oxide film 120 adjusts the surface energy by being provided with an organic group, and functions also as the orientation control layer (similar to the first example).

When a resist pattern for chemical guide pattern formation is formed by ArF exposure, the Si oxide film 120 and the C film 115 have the function of the anti-reflective film. This will now be described.

First, reflection is described with reference to FIG. 5.

Figure 5:
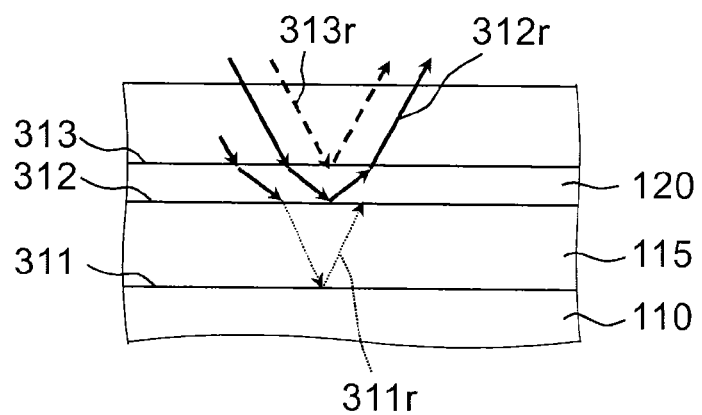
FIG. 5 is a schematic view illustrating reflection in the pattern formation method according to the embodiment.

FIG. 5 is a schematic view illustrating reflection in the pattern formation method according to the embodiment.

Reflection occurs at interfaces; specifically, at the (resist)/(Si oxide film) interface 313, the (Si oxide film)/(C film) interface 312, and the (C film)/(film to be processed) interface 311.

The C film 115 has a large extinction coefficient to ArF light (wavelength: 193 nm), and is a light blocking film when having film thickness more than a certain value. For example, the extinction coefficient k of a coating-type C film is 0.39 to light of a wavelength of 193 nm. When the intensity of the reflected light generated at the (C film)/(film to be processed) interface 311 (the (C film)/(film to be processed) interface reflected light 311r) is denoted by $I_{CR}$, the intensity I decreases as the height z of the C film 115 increases (with proximity to the top of the C film 115), and is expressed as follows.

$I = I_{CR} \exp(-4 \pi k z / \lambda)$  $\lambda$: wavelength

At a film thickness of 300 nm, the reflected light is $5 \times 10^{-4} I_{CR}$, and the reflection between the C film and the film to be processed can be sufficiently reduced. Herein, the thickness of the C film is set to 300 nm.

Next, the reflection at the (resist)/(Si oxide film) interface 313 is investigated. The reflected light (the (resist)/(Si oxide film) interface reflected light 313r) not only forms a background of the aerial image given to a resist 131, but also is reflected at the upper surface of the resist 131 to form a standing wave. Due to the standing wave, the dimensions of the side wall vary in the vertical direction with a constant period. This structure uses the reflection at the (Si oxide film)/(C film) interface 312 to cancel the reflection at the (resist)/(Si oxide film) interface 313. The cancellation is carried out by shifting the phase of the light 312r reflected at the interface (Si oxide film)/(C film) interface by 180 degrees from the phase of the light 313r reflected at the (resist)/(Si oxide film) interface.

Figure 6:
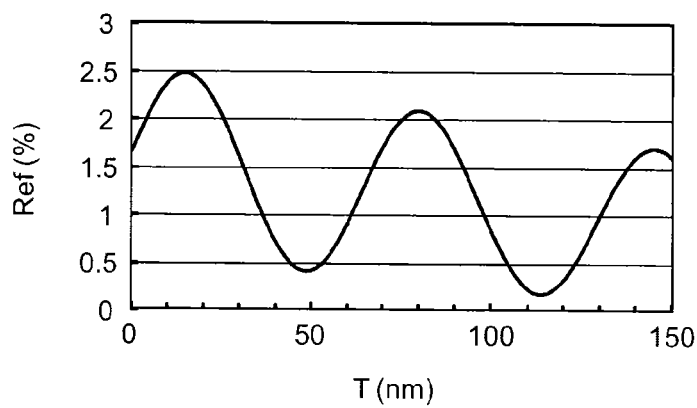
FIG. 6 is a graph illustrating the reflectivity in the pattern formation method according to the embodiment.

FIG. 6 is a graph illustrating the reflectance in the pattern formation method according to the embodiment. The horizontal axis of FIG. 6 is the film thickness T (nm) of the SOG film (the Si oxide film 120). The vertical axis is the reflectance Ref (%). The drawing illustrates the reflectance Ref at the resist/SOG interface when the film thickness of the C film 115 is set to a fixed value and the film thickness T of the SOG (the Si oxide film 120) is changed (in other words, when the phase of the light 312r reflected at the (Si oxide film)/(C film) interface is changed). By selecting the film thickness of the SOG at a minimum reflectance, the reflectance at the resist/SOG interface can be suppressed. At a film thickness of 48 nm, the reflectance Ref can be suppressed to 0.4%. When the patterning of the resist 131 was performed, no standing wave was observed, and a sufficient process window to form a resist L & S pattern with an HP of 44 nm by immersion exposure can be obtained.

FIG. 4A to FIG. 4D illustrate an example of the chemical guide pattern fabrication method according to the embodiment.

Figure 4A:
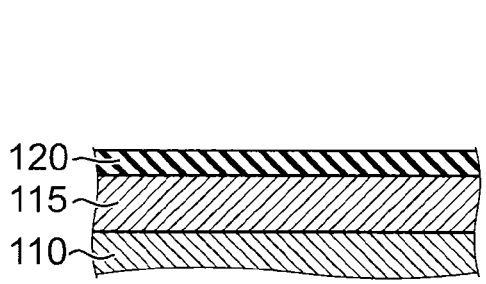
FIG. 4A to FIG. 4D are schematic cross-sectional views illustrating a pattern formation method according to the embodiment.

First, the C film 115 and the Si oxide film 120 are formed in this order on the film to be processed 110 (FIG. 4A).

Figure 4C:
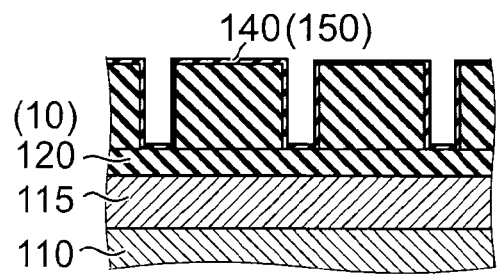
Figure 4B:
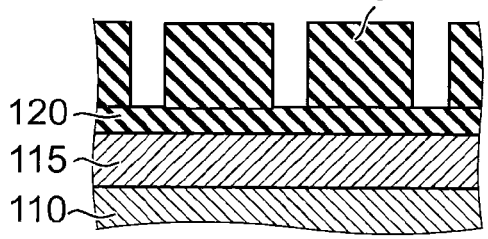

Next, a resist pattern is formed thereon. A resist is applied, then baking is performed, and then exposure, post-exposure baking, and development are performed. Thereby, a resist pattern (the resist 131) is formed (FIG. 4B).

Next, the pinning layer is formed on the resist pattern. Similarly to the first example, a resin in which a cross-linkable resin and a cross-linker that are cross-linkable using an acid as a catalyst are dissolved in water or alcohol is applied. The acid generated in an exposure process serves as a catalyst and heating is performed; thereby, the resin reacts with the hydroxyl group at the surface of the Si oxide film 120 and the methacrylic acid of the resist 131 and is cross-linked. The uncross-linked cross-linker and cross-linkable resin in the resulting matter are removed by water or alcohol. Thereby, the cross-linked film 140 is formed on the surface of the resist and the surface of the Si oxide film as illustrated in FIG. 4C. (So that the thickness difference between the film on the surface of the resist and that on the surface of the Si oxide film is set large, a photoacid generator or a thermal acid generator may be put into the Si oxide film 120. Since the photoacid generator generates an acid in resist exposure, a difference in the concentration of acid can be made between the surface of the resist and the surface of the Si oxide film. In the case of the thermal acid generator, those that do not generate an acid at the temperature of soft baking and post-exposure baking and generate an acid at high temperature are used. After resist patterning, heating is performed to generate an acid from the thermal acid generator.)

After that, the resist 131 is removed by a resist remover. In the resist removal, also the cross-linked film 140 is removed together with the resist 131. (Instead of by using a resist remover, the resist removal may be performed also by the following method: the resist 131 is irradiated with ArF light; then post-exposure baking is performed; the protection group of the resist 131 is separated off to produce poly(methacrylic acid), which is soluble in an alkali developer; and alkali development is performed.) Thereby, such a chemical guide (pinning layer 150) as is illustrated in FIG. 4D is formed.

Figure 4D:
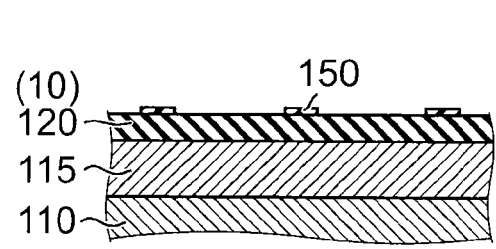

Next, a process in which a block polymer pattern oriented using the chemical guide pattern of FIG. 4D is used as an etching mask is described with reference to FIG. 7A to FIG. 7F.

FIG. 7A to FIG. 7F are schematic cross-sectional views illustrating a pattern formation method according to the embodiment.

The case where PS-b-PMMA is used is taken as an example for description. The processes of the microphase-separation of the block polymer (FIG. 7A), the removal of the PMMA 162 (FIG. 7B), and the etching of the SOG (the Si oxide film 120) using the PS 161 as a mask (FIG. 7C) are similar to the first example.

First, a block copolymer of PS-b-PMMA with a molecular weight of 73000 and a PS volume fraction of 51% is applied onto the chemical guide, and annealing is performed at 200° C. for 24 hours. Thereby, a microphase-separation occurs to obtain a BCP pattern with a period of 44 nm like FIG. 7A. In this case, since frequency doubling has been performed, a BCP with a period of half the guide pattern period is arranged.

Figure 7A:
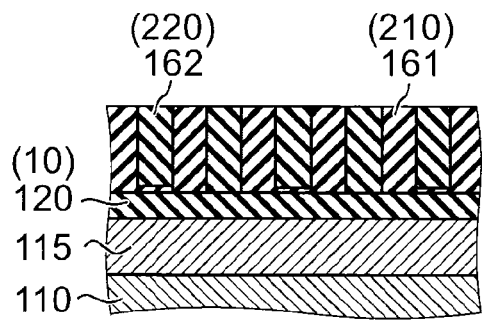
FIG. 7A to FIG. 7F are schematic cross-sectional views illustrating a pattern formation method according to the embodiment.
Figure 7B:
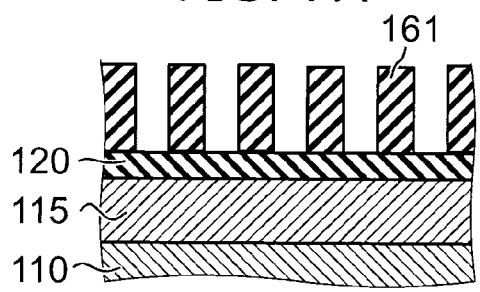
Figure 7C:
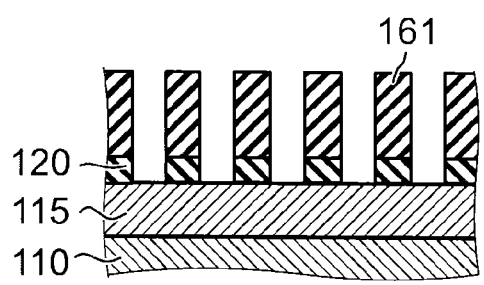
Figure 7D:
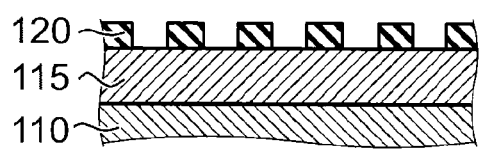
Figure 7E:
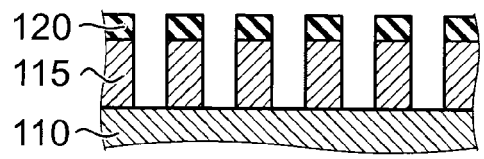
Figure 7F:
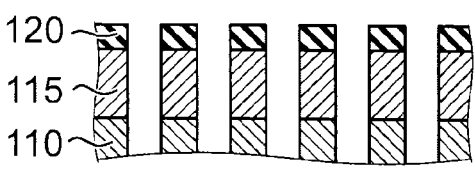

The PMMA 162 is removed by oxygen plasma. Thereby, an L & S pattern made of the PS 161 like FIG. 7B is obtained. The subsequent processes are similar to the pattern transfer process of a common resist. The PS pattern is used as a mask to etch the SOG using a fluorine-based gas (FIG. 7C). The structure illustrated in FIG. 7D is formed. Next, the SOG (the Si oxide film 120) is used as a mask to etch the C film using $CF_4/O_2/Ar$ gas (FIG. 7E). Next, the C film 115 is used as a mask to etch the film to be processed 110 (FIG. 7F). The etching selection ratio of the resist 131 to the SOG was 2.5, and the etching selection ratio of the SOG to the C film 115 was 30. The selectivity between the C film 115 and the film to be processed 110 varies with the material. In the case where the film to be processed 110 is SiN, the selection ratio is 1.2 when using $CF_4/O_2/Ar$ gas. Thus, materials that can provide high selectivities are used to perform the pattern transfer from the PS 161 to the SOG (the Si oxide film 120), the C film 115, and the film to be processed 110 in order. Thereby, the film to be processed 110 can be processed with high accuracy.

The etching selectivity varies with the method for forming the material, the type of the gas used, the mixing ratio, the structure of the etching apparatus, power, etc. Thus, etching conditions are selected in accordance with the purpose.

Although TMOS and MTMS are used as the source material of the SOG in the above, the source material is not limited thereto. In place of TMOS, a structure of $Si(OR)_4$ in which R is one of an ethyl group, a propyl group, a butyl group, and a phenyl group may be used. In place of MTMS, a structure having one of $R_aSi(OR_b)_3$, $R_{a2}Si(OR_b)_2$, and $R_{a3}SiOR_b$ in which $R_a$ is one of a methyl group, an ethyl group, a propyl group, a butyl group, and a phenyl group and $R_b$ is one of a methyl group, an ethyl group, a propyl group, a butyl group, and a phenyl group may be used. In addition, an alkylchlorosilane may be used. Examples include structures of $RSiCl_3$, $R_2SiCl_2$, and $R_3SiCl$ in which R is one of a methyl group, an ethyl group, a propyl group, a butyl group, and a phenyl group. The oxide film is a spin-on glass which can be formed by, for example, the hydrolysis and dehydration condensation of the source material mentioned above.

Furthermore, as the material of the SOG, instead of using a tetraalkoxysilane $(Si(OR)_4)$ such as TMOS, a structure having one of $R_aSi(OR_b)_3$, $R_{a2}Si(OR_b)_2$, and $R_{a3}SiOR_b$ in which $R_a$ is one of a methyl group, an ethyl group, a propyl group, a butyl group, and a phenyl group and $R_b$ is one of a methyl group, an ethyl group, a propyl group, a butyl group, and a phenyl group may be used. In addition, an alkylchlorosilane may be used. Examples include structures of $RSiCl_3$, $R_2SiCl_2$, and $R_3SiCl$ in which R is one of a methyl group, an ethyl group, a propyl group, a butyl group, and a phenyl group. At least one of them may be used as a source gas.

In the foregoing, the case is described where an SOG is used as the oxide film (e.g. the Si oxide film 120). However, the oxide film is not limited thereto but may be formed by chemical vapor deposition (CVD). As the source gas of the Si oxide film 120, a mixed gas of tetraethoxysilane (TEOS, $Si(OEt)_4$) and oxygen is used in most cases. (TEOS is liquid at normal temperature and atmospheric pressure, but becomes gas by being introduced into a vacuum. Among the Si-containing gases described below, similarly, also what is liquid at normal temperature and atmospheric pressure but becomes gas by being introduced into a vacuum or being heated as necessary is referred to as gas.) Also the film has a high surface energy and does not serve as the orientation control layer by itself. The film is modified into the orientation control layer by being provided with an organic group to its surface.

Such gases as below may be used in order to introduce an organic group. As in the case of the SOG, MTMS may be used also for the oxide film formed by CVD. The gas mixed in order to introduce an organic group is not limited to MTMS. A structure having at least one of $R_aSi(OR_b)_3$, $R_{a2}Si(OR_b)_2$, and $R_{a3}SiOR_b$ in which $R_a$ is at least one of a methyl group, an ethyl group, a propyl group, a butyl group, and a phenyl group and $R_b$ is at least one of a methyl group, an ethyl group, a propyl group, and a phenyl group may be used. In addition, an alkylchlorosilane may be used. Examples include a structure of one of $RSiCl_3$, $R_2SiCl_2$, and $R_3SiCl$ in which R is at least one of a methyl group, an ethyl group, a propyl group, a butyl group, and a phenyl group.

Furthermore, not limited to linear-chain gases, a cyclosilane may be used.

Figure 8:
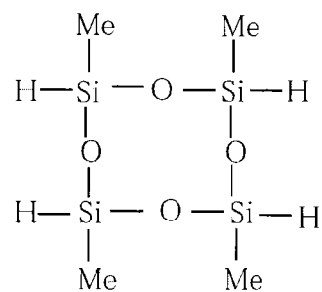
FIG. 8 is a structure formula for a material used for the pattern formation method according to the embodiment.

FIG. 8 is a schematic diagram illustrating a material used for the pattern formation method according to the embodiment. As shown in FIG. 8, for example, tetramethylcyclotetrasiloxane (TMCTS) may be used. Other than TMCTS, a structure may be used having a composition of $(R_1R_2SiO)_n$ in which $R_1$ and $R_2$ are one of hydrogen, methyl, ethyl, propyl, butyl, and phenyl and n is three or more.

Although using oxygen and TEOS is described in the above, the tetraalkoxysilane $(Si(OR)_4)$ is not limited to TEOS. R may be a methyl group, a propyl group, a butyl group, and a phenyl group.

Any of only the gas for introducing an organic group mentioned above, a mixed gas of the gas for introducing an organic group and oxygen, and a mixed gas of the gas for introducing an organic group, a tetraalkoxysilane, and oxygen may be used.

Further, since it is sufficient that an organic group is present at the surface layer, the gas for introducing an organic group does not need to be put in from the beginning of the film-formation of the Si oxide film 120. It is also possible to use a mixed gas of a tetraalkoxysilane and oxygen as the source gas in the beginning of the film-formation, switch the gas in the course of the film-formation, and add at least one of the gas for introducing an organic group, an alkylalkoxysilane, an alkylchlorosilane, and an alkylcyclosiloxane to decrease the surface energy of the oxide film. Furthermore, to introduce an organic group, it is also possible to introduce a hydrocarbon gas such as methane, ethane, propane, and butane. Furthermore, since an organic group exists only at the surface of the oxide film, the etching rate of the portion other than the surface is low when the underlying C film is etched, and therefore good performance is obtained also as an etching mask.

Although a mixed gas of TEOS and MTMS is used as the source material from the beginning, also a method in which the oxygen amount is reduced at time of the surface layer formation has similar effects.

The structure according to the embodiment can be applied also to the case where a resist pattern is used as a physical guide. The resist physical guide is a resist pattern. A neutralization film is formed in a space portion of the resist pattern. The resist pattern edge serves as the starting point of BCP arrangement after BCP microphase-separation.

Figure 9A:
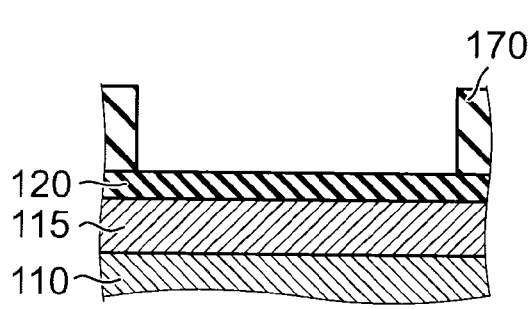
FIG. 9A and FIG. 9B are schematic cross-sectional views illustrating pattern formation according to the embodiment.
Figure 9B:
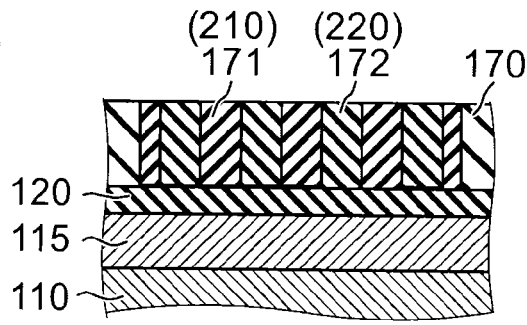

FIG. 9A and FIG. 9B are schematic cross-sectional views illustrating pattern formation according to the embodiment.

FIG. 9A illustrates a resist physical guide to which the pattern formation method according to the embodiment is applied. FIG. 9B illustrates a state after microphase-separation. In this example, since there is an affinity between a resist pattern (a resist physical guide 170) and a first polymer 171, the first polymer 171 forms a wet layer on the resist pattern side. After that, a second polymer 172 and the first polymer 171 are alternately aligned.

Since the resist pattern of the resist physical guide 170 is the same as that in ordinary light exposure, the same anti-reflective function is utilized. The stacked structure of the Si oxide film 120/the C film 115 has the function of the anti-reflective film. The orientation control layer is provided in order to make the lamella of the BCP stand, and this is the Si oxide film 120. One block of the BCP pattern formed is removed and the remaining block is used as a mask to perform the pattern transfer to the Si oxide film 120 and further to the C film 115. Thereby, a pattern of the film to be processed can be formed with high accuracy.

Hereinabove, methods for forming an L & S pattern by orienting the lamellar structure vertically are described. However, also in the case where the cylindrical structure is vertically oriented, the Si oxide film 120 may be used as the orientation control layer and similar processes to the above may be used to form a chemical guide. In the case of the cylinder, the guide pattern forms not an L & S pattern but a C/H pattern of a two-dimensional hexagonal lattice.

Figure 11A:
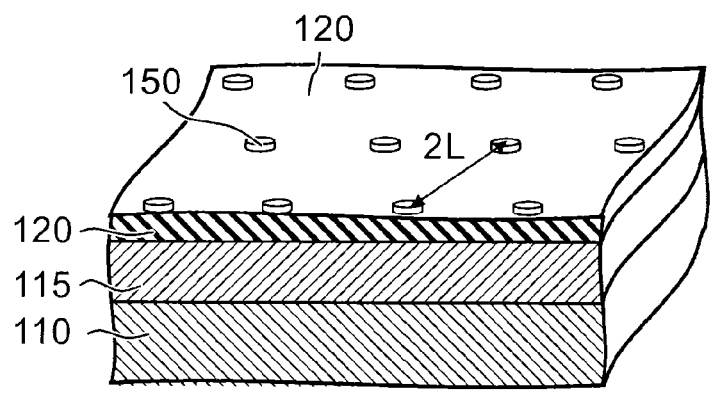
FIG. 11A and FIG. 11B are schematic perspective views illustrating a pattern formation method according to the embodiment.
Figure 11B:
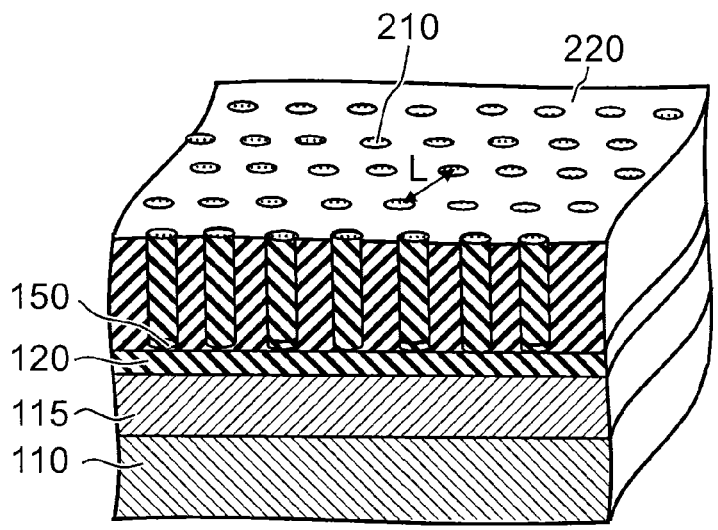

FIG. 11A and FIG. 11B are schematic perspective views illustrating a pattern formation method according to the embodiment.

FIG. 11A illustrates a chemical guide pattern. The pinning layer 150 is formed on the Si oxide film 120. FIG. 11B illustrates a state after microphase-separation. When the distance between the holes of block copolymers is denoted by L, the distance between pillars composed of the pinning layer of a chemical guide pattern is an integral multiple of L. FIG. 11A and FIG. 11B illustrate the case of twice of L.

FIG. 12A to FIG. 12D are schematic plan views illustrating a pattern formation method according to the embodiment. The drawings are plane views from the direction perpendicular to the major surface of the Si oxide film 120.

Figure 12A:
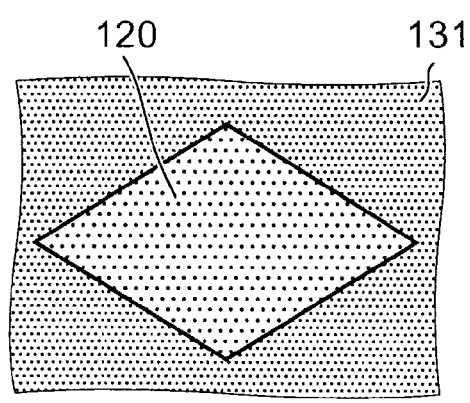
FIG. 12A to FIG. 12D are schematic plan views illustrating a pattern formation method according to the embodiment.
Figure 12B:
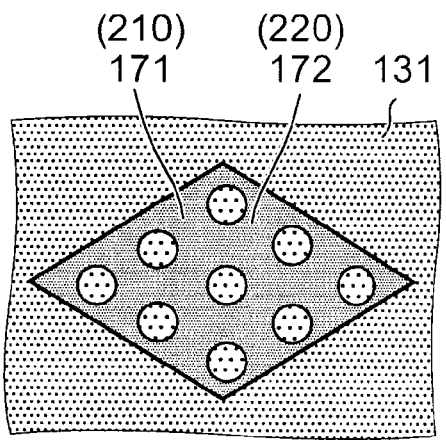
Figure 12C:
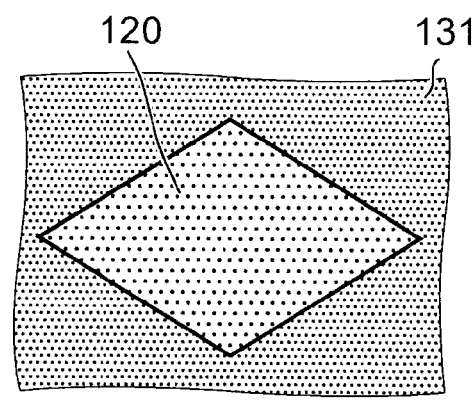

In the case of a physical guide, a rhombic resist pattern (the resist 131) with an angle of 60 degrees or 120 degrees is formed on a stacked structure of the film to be processed 110, the C film 115, and the Si oxide film 120 (FIG. 12A and FIG. 12C). Since the Si oxide film 120 is the orientation control layer, the cylinder is vertically oriented. Since the side wall of the resist pattern has an angle of 60 degrees or 120 degrees, the block copolymer can have a configuration of a two-dimensional hexagonal lattice therein and be regularly arranged.

Figure 12D:
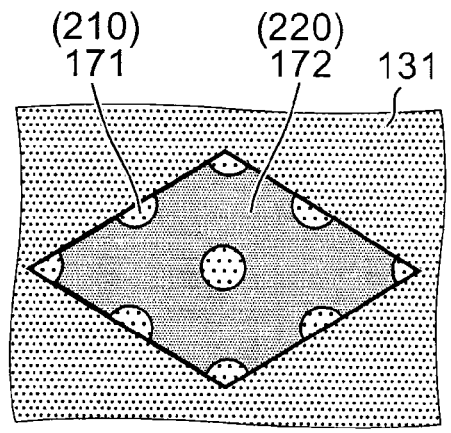

In the case where the resist 131 has an affinity with the second polymer (172), as illustrated in FIG. 12B, the cylinder is oriented along the side surface having an angle of 60 degrees or 120 degrees after a wet layer is formed on the side surface of the resist pattern. In the case where the resist has a surface energy between that of the first polymer 171 and that of the second polymer 172, the cylinder is in a semicircular form to be aligned on the side wall of the resist pattern, and is regularly arranged (FIG. 12D).

Although the physical guide has a rhombic form herein, a form such as a regular hexagon is possible. Any configuration of a guide pattern having an apex with an angle of approximately 60 degrees or approximately 120 degrees as viewed from the upper surface is possible so that a two-dimensional hexagonal lattice can be arranged.

In the foregoing, the affinity between the orientation control layer or the pinning layer 150 and the polymers constituting the BCP is described using the "surface energy." The Si oxide film 120 has the function of a neutralizing film, and the Si oxide film 120 has a surface energy between those of the two kinds of polymers constituting the BCP. The term "surface energy" will now described. Surface energy is the Gibbs free energy at the surface. Since surface tension is the Gibbs free energy at the surface per unit area, surface energy can be obtained by measuring the surface tension of solid.

There are some methods for measuring the surface tension of solid. In any method, a liquid in which the components of the surface tension are known is used, and the contact angle between the liquid and a solid of which the surface tension should be obtained is measured.

The work of adhesion and the contact angle are related by the Young-Dupre equation ($\theta$: contact angle, $\gamma_L$: the surface tension of liquid, $W_{SL}$: the work of adhesion which decreases due to the adhesion of solid and liquid) as below:

$$(1+\cos\theta)\gamma_L = W_{SL}$$

On the other hand, the work of adhesion is described based on a model using the surface tension components. The surface tension components of solid can be obtained because the surface tension components of liquids are known. At this time, measurement may be carried out using the same number of kinds of liquids as the number of unknown surface tension components; thereby, the unknown surface tension components of solid are obtained.

For example, according to the Fowkes-van Oss-Chaudhury-Good (FOCG) surface tension model, the surface tension of solid is composed of the Lifshitz-van der Waals component and the polar interaction component of Lewis acid/base.

$$\gamma^{total} = \gamma^{LW} + \gamma^{AB}$$

where $\gamma^{LW}$ is the Lifshitz-van der Waals component. $\gamma^{AB}$ is the polar interaction (or the hydrogen bonding component). $\gamma^{AB}$ is expressed as follows:

$$\gamma^{AB} = 2(\gamma^+ \gamma^-)^{1/2}$$

where $\gamma^+$ is the electron donor component and $\gamma^-$ is the electron acceptor component.

The work of adhesion $W_{SL}$ is expressed as follows:

$$W_{SL} = 2\{(\gamma_S^{LW}\gamma_L^{LW})^{1/2} + (\gamma_S^+\gamma_L^-)^{1/2} + (\gamma_S^-\gamma_L^+)^{1/2}\}$$

Thereby, the following expression is provided.

$$(1+\cos\theta)\gamma_L = 2\{(\gamma_S^{LW}\gamma_L^{LW})^{1/2} + (\gamma_S^+\gamma_L^-)^{1/2} + (\gamma_S^-\gamma_L^+)^{1/2}\}$$

Since the components with regard to liquid $\gamma_L$, $\gamma_L^{LW}$, $\gamma_L^+$, and $\gamma_L^-$ are known, the surface tension components of solid which are to be obtained are $\gamma_S^{LW}$, $\gamma_S^+$, and $\gamma_S^-$, and the number of variables is three. Therefore, the contact angle is measured for three kinds of liquids to obtain the surface tension components of solid. The surface tension of solid is obtained from the surface tension components of the solid.

Other than the FOCG model, there is also a model in which surface tension is divided into the dispersion force, the interaction force due to polarity, and the hydrogen bonding force and the work of adhesion $W_{SL}$ is expressed by the following formula:

$$W_{SL} = 2\{(\gamma_S^d\gamma_L^d)^{1/2} + (\gamma_S^P\gamma_L^P)^{1/2} + (\gamma_S^H\gamma_L^H)^{1/2}\}$$

where $\gamma^d$ is the dispersion force, $\gamma^P$ is the polar force, and $\gamma^H$ is the hydrogen bonding force. The surface tension of solid can be similarly found using this formula.

To investigate the affinity between liquid and solid, there is also a method in which liquid is dropped onto solid to measure the contact angle.

For example, the work of adhesion can be calculated from the Young-Dupre equation, that is, $(1+\cos\theta)\gamma_L = W_{SL}$ ($\theta$ being the contact angle, $\gamma_L$ being the surface tension of liquid, and $W_{SL}$ being the work of adhesion which decreases due to the adhesion of solid and liquid). The work of adhesion is expressed by the following formula:

$$\gamma_{SL} = \gamma_S + \gamma_L - W_{SL}$$

where $\gamma_{SL}$ is the interfacial energy between solid and liquid, $\gamma_S$ is the surface energy of solid, and $\gamma_L$ is the surface energy of liquid. In other words, the work of adhesion is the energy reduction due to the adhesion of liquid and solid. The larger the work of adhesion is, the more stable the system is. In other words, the affinity is high. If the contact angles of different solids are measured using the same liquid based on this, the affinity between solids can be compared.

Next, another example of the pinning layer formation method is described.

Figure 10:
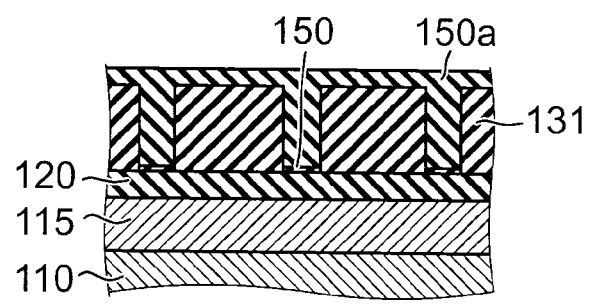
FIG. 10 is a schematic cross-sectional view illustrating a pattern formation method according to the embodiment.

FIG. 10 is a schematic cross-sectional view illustrating a pattern formation method according to the embodiment.

In this example, a film is selectively formed only on the Si oxide film in the resist space portion. In this example, after the resist pattern described in regard to FIG. 4B is formed, a pinning layer precursor 150a is supplied and reacted with the hydroxyl group at the surface of the Si oxide film (FIG. 10). After that, the unreacted pinning layer precursor 150a is removed to obtain a chemical guide pattern (the pinning layer 150 illustrated in FIG. 4D).

In this example, the pinning layer precursor 150a is polymers or molecules having substantially the same surface energy as one polymer of the block copolymer, and the end thereof is one of an OH group, a Cl group, and an alkoxy group. As an example of the end being OH, PS—$C_2H_4$—OH or the like, for example, may be used when the BCP is, for example, PS-PMMA. When the BCP is PS-polydimethylsilane (PDMS), $C_2H_5CH(CH_3)$—PDMS—OH or the like, for example, may be used. As an example of the end being a Cl group or an alkoxy group, a silane coupling agent is given. In this case, one in which the surface energy of the organic group portion is approximately equal to that of the BCP is used. For example, it is also possible to use one having the molecular formula Ph-R—$SiCl_3$ in which R is a linear alkyl and the number of C (carbon) is changed depending on the surface energy.

The polymers or molecules mentioned above are dissolved in a solvent and applied to be supplied to the surface of the Si oxide film. The Cl group reacts at a relatively low temperature in a short time, and on the other hand the OH group and the alkoxy group are heated to be reacted with the hydroxyl group at the surface of the Si oxide film 120. The unreacted precursor is removed by the solvent to form the pinning layer 150.

In order that the resist 131 may not be dissolved by the solvent that dissolves the pinning layer precursor 150a, a treatment is performed on the resist 131 beforehand.

In a first example, the resist 131 is developed with an organic solvent such as anisole. In this case, the protection group has been separated off in the resist pattern remaining after development, and polymethacrylate constitutes the main component in the case of an ArF resist. Consequently, the resulting matter becomes insoluble in a solvent such as toluene and propylene glycol methyl ether acetate which may be a solvent of the pinning layer precursor 150a described above.

In another example, the resist 131 is developed with an alkali developer, for example, tetramethylammonium hydroxide. After that, exposure and baking are performed to separate off the protection group of the resist 131, and the resulting matter can similarly become insoluble in a solvent such as toluene and polyethylene glycol methyl ether acetate which may be a solvent of the pinning layer precursor 150a described above.

In still another example, the pinning layer precursor 150a in a gaseous form like a polysilazane is supplied to the surface of the Si oxide film. Also a polysilazane reacts with the hydroxyl group at the surface of the Si oxide film 120 at a temperature of approximately 100° C. in a short time, and forms a self-assembled monolayer (SAM).

In the examples mentioned above, PS-b-PMMA is used as the BCP. However, the BCP is not limited to PS-b-PMMA. Any material may be used as the BCP to the extent that it is a combination of polymers having a sufficient X parameter to for microphase-separation, such as PS-b-poly(2-vinylpyridine), PS-b-polyisoprene (PI), PS-b-poly(ethylene oxide) (PEO), PS-b-polydimethylsiloxane (PDMS), PI-b-PEO, polybutadiene (PB)-b-poly(hexafluoropropylene oxide), polypentafluorostyrene-b-PMMA, PS-b-poly{11-[4-(4-butylphenylazo)phenoxy]undecyl methacrylate} (PMAAzo), PEO-b-PMAAzo, PS-b-polyhedral oligomeric silsesquioxane methacrylate (PMAPOSS), and PMMA-PMMAPOSS. It is possible to use the method by selecting the BCP in accordance with the purpose such as etching resistance, desired sizes, etc.

The block polymer is not limited to diblockcopolymers. For example, the block polymer may be a triblock polymer composed of three kinds of polymers. In this case, when the three kinds of polymers are A, B, and C, the lamellar structure is a repetition of -A-B-A-C- or a repetition of -A-B-C-. Therefore, the surface energies of the pinning layer and the orientation control layer may be adjusted so that the affinity of the pinning layer of a guide pattern may be high only with the polymer A and the affinities between the orientation control layer and the polymer A, between the orientation control layer and the polymer B, and between the orientation control layer and the polymer C may be almost equal. Thereby, the lamella can be similarly arranged. Examples of the triblock polymer include PS-b-PB-b-PMMA, PS-b-(polyethylene-co-polybutylene)-b-PMMA, and the like. As in the case of the BCP, it is possible to use the pattern formation method according to the embodiment by selecting the type of the triblock polymer in accordance with the purpose also in the case of the triblock polymer.

In the embodiment, for example, the microphase-separation of the block polymer is performed by heating in a forming gas. However, this may be performed in a vacuum or nitrogen. Furthermore, instead of by heating, it is also possible to perform microphase-separation by a method in which a substrate with a chemical guide to which the block polymer is applied is placed in an organic solvent atmosphere to move the polymer (solvent anneal).

The removal of one polymer is not limited to such a method using $O_2$ plasma as is described in the examples mentioned above. In dry development, a gas that can provide a selectivity between polymer 1 and polymer 2 may be selected. Also a halogen-based gas including fluorine, chlorine, bromine, or iodine or a carbon halogenide may be used. Furthermore, a small amount of gas may be added to a halogen-based gas to control the selection ratio and configuration. Also wet development is possible as well as dry development. In the case of PS-b-PMMA, for example, PMMA may be irradiated with UV light to cut the polymer chain and development may be performed with acetic acid. Furthermore, heat may be used to vaporize away one polymer. For example, PS-b-PMMA may be irradiated with UV light in a vacuum to remove PMMA. In the case of PS-PDMS, heating may be performed to 400° C. or higher in a vacuum to remove PS. The method for removing one polymer may be variously selected based on the BCP used.

In the embodiment, for example, ArF exposure is used. However, in the embodiment, the wavelength of light exposure is not limited to 193 nm of ArF excimer laser light. Ultraviolet light such as KrF excimer laser light with a wavelength of 243 nm, the i line of a mercury lamp (wavelength: 365 nm), and the g line (wavelength: 436 nm) may be used. Similar effects are obtained by taking measures of anti-reflection in a light exposure used in the pattern formation method according to the embodiment.

Furthermore, the material and process conditions may be appropriately altered without departing from the spirit of the embodiment.

In the embodiment, the film to be processed 110 can be processed with high accuracy by transferring a pattern formed of the remaining block of the block polymer to the Si oxide film 120 and further to the organic film. Since the Si oxide film 120 and the organic film serve as at least the anti-reflective film at the time of light exposure, chemical guide pattern in which the block polymer is regularly arranged can be formed by inexpensive light exposure tools. Since the Si oxide film 120 has a substantially equal affinity with the plurality of polymers constituting the block polymer, the Si oxide film 120 serves as the orientation control layer for orienting the lamellar structure of the block polymer perpendicularly to the surface of the Si oxide film 120 or for orienting the cylindrical structure so that it may have an axis parallel to the normal line of the surface of the Si oxide film 120. Thus, a chemical guide pattern having the functions of the pattern transfer film, the anti-reflective film, and the orientation control layer can be formed inexpensively.

In the embodiment, since the Si oxide film 120 and the organic film serve as at least the anti-reflective film at the time of light exposure, physical guide pattern formation in which a resist pattern for regularly arranging the block polymer is used as a physical guide can be performed by inexpensive light exposure tools. Since the Si oxide film 120 has a substantially equal affinity with the plurality of polymers constituting the block polymer, the Si oxide film 120 serves as the orientation control layer for orienting the lamellar structure of the block polymer perpendicularly to the surface of the Si oxide film 120 or for orienting the cylindrical structure so that it may have an axis parallel to the normal line of the surface of the Si oxide film 120. Thus, a resist physical guide pattern having the functions of the pattern transfer film, the anti-reflective film, and the orientation control layer can be formed inexpensively.

The embodiment can provide a pattern formation method in which the block polymer is microphase-separated with a desired orientation in a desired position and at least one polymer block of the microphase-separated block polymer is used as a mask to process the film to be processed.

In the first example, the case is described where hydroxyl groups at the surface of a Si oxide film and an acid cross-linkable film react together to form an acid cross-linked film in a space portion of a resist pattern. However, an organic group is introduced into the surface of the Si oxide film when the Si oxide film is formed. Thereby, the Si oxide film serves as a neutralization film for orienting a block copolymer vertically. Therefore, there is a case where the surface of the Si oxide film is covered with organic groups and has a small amount of hydroxyl groups or very few hydroxyl groups.

In such a case, no reaction occurs between the hydroxyl group at the surface of the Si oxide film and a material that forms a second surface energy layer (e.g. a pinning layer).

However, it is possible to form an acid cross-linked film pattern by adding a photoacid generator (PAG) into an SOG.

FIG. 13A to FIG. 13F are schematic cross-sectional views illustrating a pattern formation method according to the embodiment.

Figure 14:
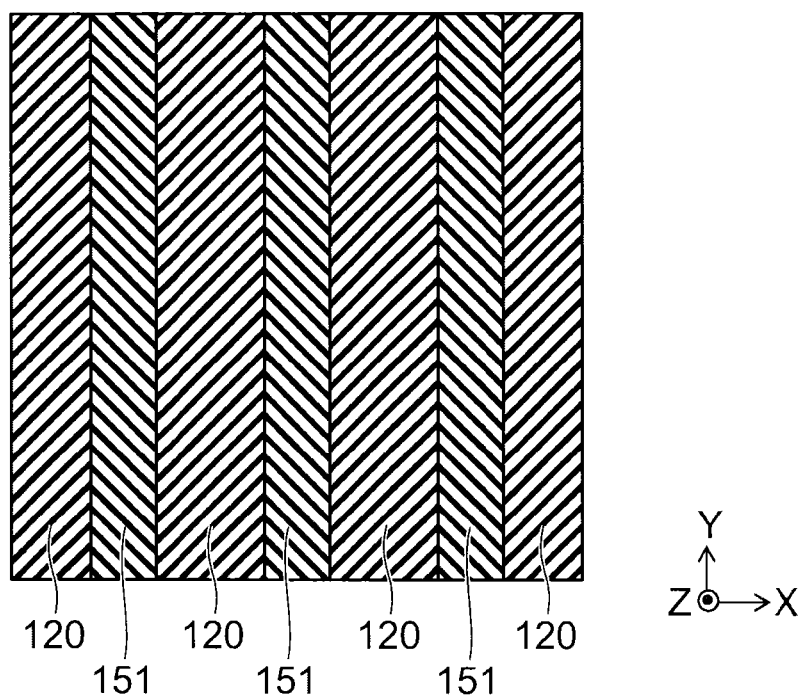
FIG. 14 is a schematic plan view illustrating the pattern formation method according to the embodiment.

FIG. 14 is a schematic plan view illustrating the pattern formation method according to the embodiment.

Figure 13A:
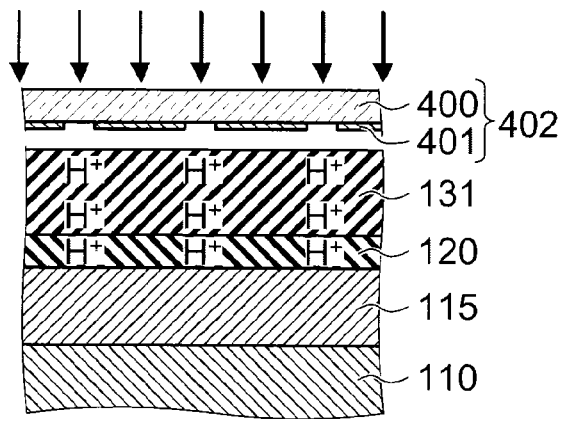
FIG. 13A to FIG. 13F are schematic cross-sectional views illustrating a pattern formation method according to the embodiment.

First, a photoacid generator is added to an SOG. The SOG with the added photoacid generator is applied onto the C film 115; thereby, the Si oxide film 120 with the added photoacid generator is formed on the C film 115. Next, the resist 131 is formed on the Si oxide film 120. Next, a mask 402, in which a light blocking layer 401 is patterned on a light-transmissive substrate 400, is placed on/above the resist 131. When the resist 131 is exposed to light using the mask 402, an acid is generated from a photoacid generator in the resist and an acid is generated also from the photoacid generator in the Si oxide film (FIG. 13A).

In the case where the material of the resist 131 is a positive-tone resist, an acid is generated from the photoacid generator in the Si oxide film 120 irradiated with light through portions corresponding to the space regions of the resist pattern at the time of the light exposure. After resist development, acid exists in the Si oxide film in the space region of the resist 131 patterned (hereinafter, a "resist pattern") (FIG. 13B). Next, a solution 145 (a precursor of an acid cross-linked resin), in which at least one of a cross-linkable resin that is cross-linkable using an acid as a catalyst and a cross-linker that is cross-linkable using an acid as a catalyst is dissolved in a solvent, is supplied onto the resist 131 and onto the Si oxide film 120 which is not covered with the resist 131 (FIG. 13C).

Here, it is necessary that the solvent which does not dissolve the resist and dissolves the cross-linker and the cross-linkable resin. As the solvent, a solvent including at least one of water, an alcohol such as ethanol, n-propyl alcohol, isopropyl alcohol, butanol, and pentanol, and a propylene glycol derivative such as propylene glycol monomethyl ether, propylene glycol monoethyl ether, and propylene glycol monopropyl ether is used. The cross-linker and the cross-linkable resin are described later. The precursor of the acid cross-linked resin may be formed by spin coating.

Figure 13D:
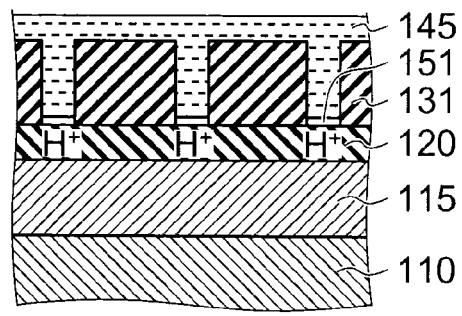
Figure 13B:
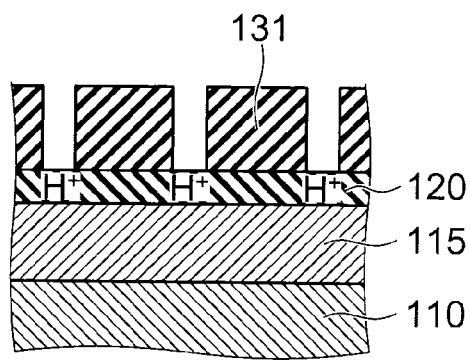
Figure 13E:
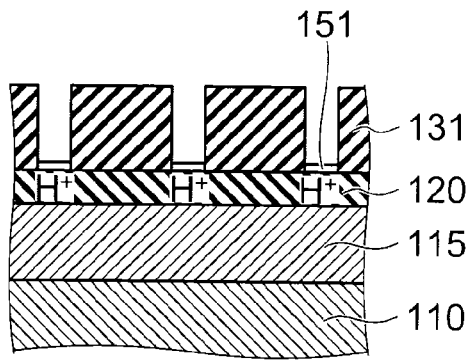
Figure 13C:
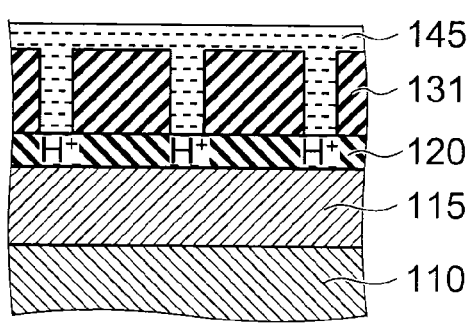

The precursor of the acid cross-linked resin is heated; thereby, the acid, the resin, and the cross-linker react together by cross-linking, and a film 151 (an acid cross-linked resin film) having the second surface energy is formed on the surface of the Si oxide film (FIG. 13D). After that, the unreacted, uncross-linked resin and cross-linker (precursors of the acid cross-linked resin) are removed (FIG. 13E).

Figure 13F:
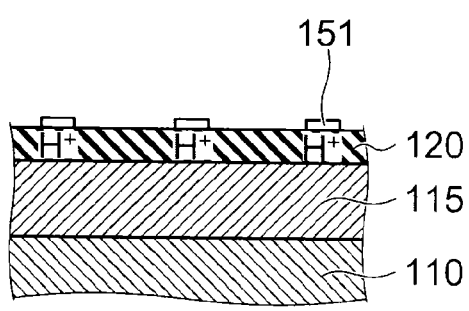

In the removing of the unreacted, uncross-linked resin and cross-linker, a solvent is used by which the unreacted resin and cross-linker are dissolved. For example, at least one of water, an alcohol such as ethanol, n-propyl alcohol, isopropyl alcohol, butanol, and pentanol, or a propylene glycol derivative such as propylene glycol monomethyl ether, propylene glycol monoethyl ether, and propylene glycol monopropyl ether is used as the solvent. Finally, the resist 131 is removed by a resist remover (e.g. cyclohexane). Thereby, the film 151 (an acid cross-linked film) having the second surface energy that is not bonded and not fixed to the surface of the Si oxide film 120 can be formed on the surface portion of the Si oxide film 120 (FIG. 13F). That is, the precursor has reacted only at the surface of the Si oxide film 120 not covered with the resist 131. The precursor reacts selectively at the surface of the Si oxide film 120 which is not covered with the resist 131 at a processing point focused on. Here, the resist 131 has been removed. As shown in FIG. 14, the film 151 (an acid cross-linked resin film) having the second surface energy extends along the Y-axis direction.

Herein, an example is shown of the case where the amount of the added photoacid generator is adjusted so that the amount of acid existing at the surface of the Si oxide film 120 may be more than the amount of acid remaining at the side wall of the resist after resist development, and the temperature of the acid cross-linking reaction is low. In this case, an acid cross-linked film is hardly produced on the side wall of the resist. Therefore, an acid cross-linked film is selectively formed only on the surface of the Si oxide film.

In the case where the acid generated in the exposure is sufficiently left at the side surface of the resist and the heating temperature for causing a cross-linking reaction is high, the case is similar to the first example. In this case, as shown in FIG. 3C, an acid cross-linked film is formed also on the side surface of the resist. However, the acid cross-linked film adhering to the side surface is removed together with the resist at the time of resist removal, and the acid cross-linked film is left only on the surface of the Si oxide film.

In the first example, an acid cross-linked resin film polymerizes by cross-linking the hydroxyl group at the surface of an SOG and an amino resin or a cross-linker (an alkoxyurea, an alkoxymelamine, an alkoxybenzoguanamine, a urea resin, a melamine resin, or a benzoguanamine resin) in the presence of an acid. However, the resin and the cross-linker that can be used are not limited thereto.

At least one of the cross-linker and the resin includes at least one of an alkoxyurea, an alkoxymelamine, an alkoxybenzoguanamine, an isocyanate, a urea resin, a melamine resin, a benzoguanamine resin, and an oxazoline-containing resin.

At least one of the cross-linker and the resin may include at least one of an alkoxyurea, an alkoxymelamine, an alkoxybenzoguanamine, an isocyanate, a urea resin, a melamine resin, a benzoguanamine resin, and an oxazoline-containing resin, and may further include at least one of a carboxylic anhydride, acrylic acid, methacrylic acid, an isocyanate, poly(glycidyl methacrylate), poly(glycidyl acrylate), a polyester resin, an acrylic resin, a methacrylic resin, a polyvinyl alcohol derivative, a polyvinyl acetal derivative, poly(ethylene oxide), and a cycloaliphatic acrylic polymer containing an epoxy group.

At least one of the resin and the cross-linker includes an epoxy resin and further includes at least one of urea, ethyleneurea, benzoguanamine, melamine, glycoluril, an isocyanate, an amine (diethylenetriamine, triethylenetetramine, m-phenylenediamine, and methylenedianiline), a carboxylic anhydride, acrylic acid, methacrylic acid, a ketimine, a urea resin, a melamine resin, a benzoguanamine resin, a urethane resin, polyvinylamine, polyallylamine, polyethylenimine, a polyester resin, a polymercaptan, and a polyphenol.

An alkoxyurea, an alkoxymelamine, an alkoxybenzoguanamine, an isocyanate, a urea resin, a melamine resin, a benzoguanamine resin, an oxazoline-containing resin, a carboxylic anhydride (phthalic anhydride, benzophenonetetracarboxylic anhydride, hexahydrophthalic anhydride, and pyromellitic dianhydride), acrylic acid, methacrylic acid, an isocyanate, glycidyl methacrylate, glycidyl acrylate, a polyester resin, an acrylic resin, a methacrylic resin, a polyvinyl alcohol derivative, a polyvinyl acetal derivative, poly(ethylene oxide), and a cycloaliphatic acrylic polymer containing an epoxy group, for example, are cross-linkable in the presence of an acid. An acid cross-linked resin with an adjusted surface energy can be formed using the precursor solution of the acid cross-linked resin made by dissolving a composition selected among them.

An epoxy resin will react with urea, ethyleneurea, benzoguanamine, melamine, glycoluril, an isocyanate, an amine (diethylenetriamine, triethylenetetramine, m-phenylenediamine, and methylenedianiline), a carboxylic anhydride (phthalic anhydride, benzophenonetetracarboxylic anhydride, hexahydrophthalic anhydride, and pyromellitic dianhydride), acrylic acid, methacrylic acid, a ketimine, a urea resin, a melamine resin, a benzoguanamine resin, a urethane resin, an amino resin such as polyvinylamine, polyallylamine, and polyethylenimine, a polyester resin, a polymercaptan, and a polyphenol. In this case, an acid cross-linked resin with an adjusted surface energy also can be formed using the precursor solution of the acid cross-linked resin made by dissolving a composition selected among them.

Here, the control of the surface energy in the case where an acid cross-linked film is used as the second surface energy layer is described.

Figure 15:
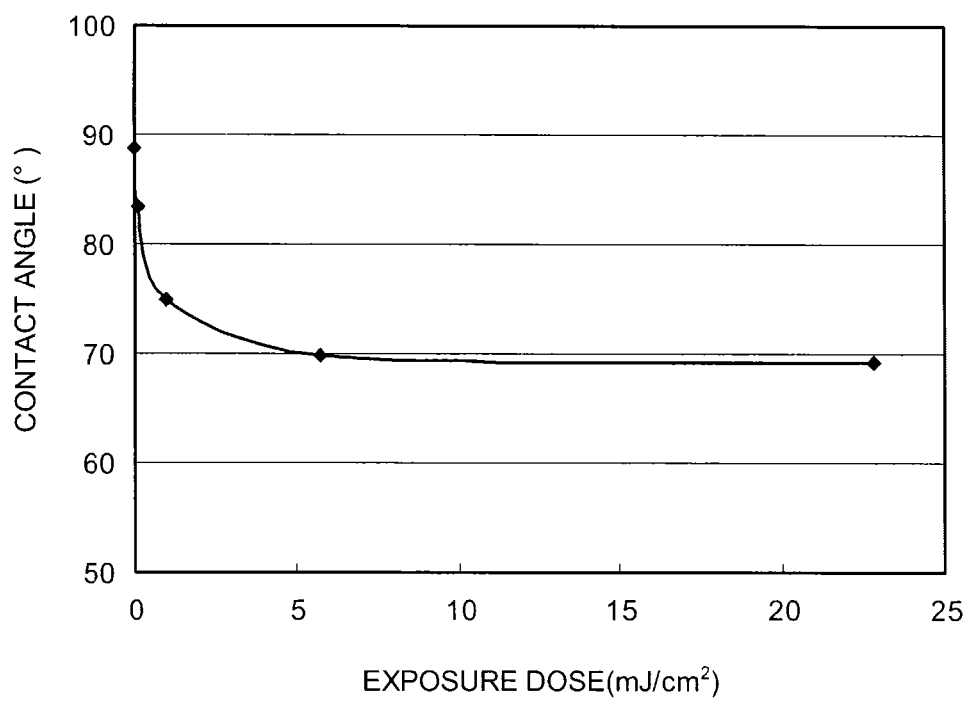
FIG. 15 is a diagram showing the relationship between the exposure dose and the contact angle according to the embodiment.

FIG. 15 is a diagram showing the relationship between the exposure dose and the contact angle according to the embodiment.

FIG. 15 shows the contact angle of water versus the exposure dose in the acid cross-linked film after irradiation of the Si oxide film, to which an acid generator is added, with ArF light, which is used to expose a resist, and heating. The acid generator is triphenylsulfonium triflate ($SPh_3^+ + CF_3SO_3^-$). Triphenylsulfonium triflate is added to an SOG solution beforehand. The acid cross-linked film is formed from poly (ethylene oxide) and methoxyethyleneurea as precursors. The heating temperature is 120° C. FIG. 15 shows that irradiation of a sufficient dose amount generates an acid from the acid generator and forms an acid cross-linked film. It is found that irradiation of a certain amount or more of exposure dose makes an acid cross-linked film with a sufficient film thickness and provides a contact angle proper to the acid cross-linked film. Since the contact angle serves as an indicator of the surface energy, a surface energy proper to the acid cross-linked film can be obtained.

The surface energy of the acid cross-linked film depends on the composition selected among resins and cross-linkers included in the precursor solution. Hence, the second surface energy can be adjusted by the composition selected among resins and cross-linkers described above.

The surface energy can be estimated by the solubility parameter. A material having high hydrophilicity tends to have a high solubility parameter and a high surface energy. In the case, for example, to reduce the surface energy when an alkoxymelamine is used as a cross-linker, the alkoxymelamine may be partly replaced with an alkoxybenzoguanamine. In the case where a urea resin, a styrene-maleic acid copolymer, and polyvinyl alcohol are used as precursors of an acid cross-linked resin, the surface energy can be reduced by increasing the ratio of styrene in the copolymer. Thus, the surface energy is adjusted by changing at least one of the types, mixing ratio, and compositions of the precursors of the acid cross-linked resin.

Furthermore, the second surface energy changes with the surface energies of the polymers constituting the block copolymer used. Therefore, depending on the type of the block copolymer, it is necessary to adjust the surface energy of the Si oxide film and the surface energy of the acid cross-linked resin. The surface energy of the Si oxide film is adjusted by the amount of organic groups introduced, as described above. The surface energy of the acid cross-linked resin is adjusted by at least one of the types, mixing ratio, and compositions of the precursors of the acid cross-linked resin, as described above. Since the surface energy of the Si oxide film and the surface energy of the acid cross-linked resin can be appropriately adjusted, it is possible to produce a Si oxide film serving as a neutralizing film and an acid cross-linked resin serving as a pinning layer. It is also possible to produce a Si oxide film serving as a pinning layer and an acid cross-linked resin serving as a neutralizing film. Also adjustment can be made so that the surface energy of the Si oxide film may be almost equal to the surface energy of one of the polymers constituting the block copolymer and the surface energy of the acid cross-linked resin may be almost equal to the surface energy of the other of the polymers constituting the block copolymer.

FIG. 15 shows that at more than a certain amount of exposure dose, the surface energy becomes the native one of the cross-linked resin. The exposure dose, at which the contact angle (the surface energy) reaches almost invariant value, needs to be adjusted to not more than the exposure dose given by light reaching at the space portion on the wafer. Since the exposure dose given by the light reaching the space portion on the wafer depends on the sensitivity and pattern dimensions of the resist, the exposure dose, at which the contact angle reaches almost invariant value, is set to a one in accordance with them. The exposure dose, at which the contact angle (the surface energy) reaches almost invariant depends not only on the types and compositions of the precursors of the acid cross-linked resin but also on the strength of the acid generated from the acid generator and additional amount of the acid generator, the temperature for cross-linking the resin and the cross-linker, etc. These conditions are adjusted to form the acid-cross linked film.

As the type of the acid generator, an acid generator having a sensitivity to ArF light may be used. For example, a triphenylsulfonium salt, a diphenylsulfonium salt, a phenylsulfonium salt, a cycloalkylsulfonium salt, a bis(tertiary butyl) phenyliodonium salt, and a naphthylsulfonate, and derivatives of them may be used.

Oxygen plasma treatment may be performed in order to form hydroxyl groups at the surface of the Si oxide film.

FIG. 16A to FIG. 16F are schematic cross-sectional views illustrating a pattern formation method according to the embodiment.

Figure 16A:
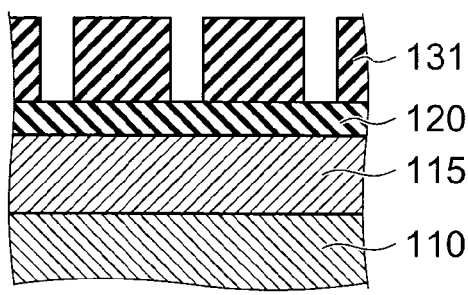
FIG. 16A to FIG. 16F are schematic cross-sectional views illustrating a pattern formation method according to the embodiment.
Figure 16D:
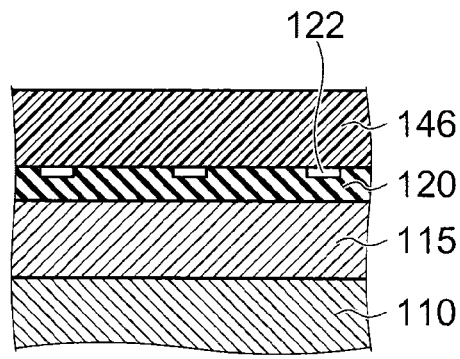
Figure 16B:
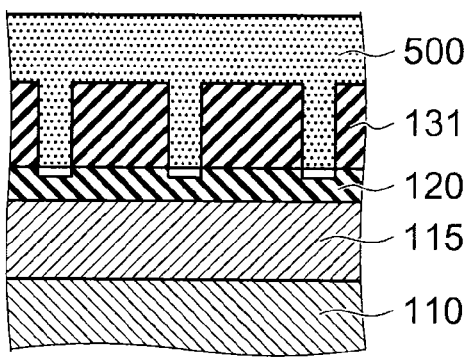
Figure 16E:
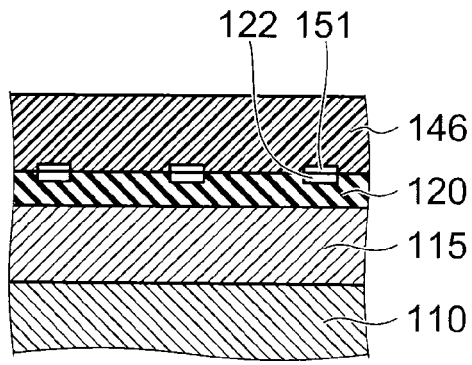

The pattern of a resist 131 is formed on the Si oxide film 120 (FIG. 16A), and then the Si oxide film 120 which is not covered with the resist 131 is exposed to oxygen plasma 500 (FIG. 16B). As an example of the oxygen plasma treatment, chemical dry etching (CDE) is used. In this method, oxygen plasma is generated from oxygen gas using a microwave of 2.45 GHz, and only oxygen radicals are made to reach a sample chamber. Oxygen plasma treatment is also performed using reactive ion etching (RIE). The energy of ions is set to the value from several watts to several tens of watts. This is because, if the energy of ions included in the oxygen plasma is high, the surface of the resist is cross-linked and removal of the resist pattern with an organic solvent becomes difficult.

Figure 16C:
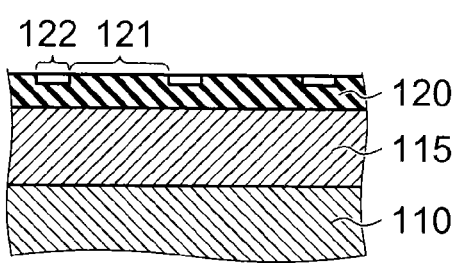

By the oxygen plasma treatment, the organic groups and organic components at the surface of the Si oxide film are removed by oxygen plasma. By taking the workpiece to the air, hydroxyl groups are formed at the surface of the Si oxide film by water included in the air. The region where hydroxyl groups are formed becomes hydrophilic. When the resist is removed, a pattern composed of a hydrophobic region 121 where organic groups are present at the surface and a hydrophilic region 122 where hydroxyl groups are present at the surface can be formed on the surface of the Si oxide film (FIG. 16C). The hydrophobic region 121 where organic groups are present at the surface may be taken as a first surface energy layer, and the hydrophilic region 122 where hydroxyl groups are present at the surface may be taken as a second surface energy layer.

After that, a film that forms the second surface energy layer may be formed in the hydrophilic region 122 where hydroxyl groups are present at the surface.

Figure 16F:
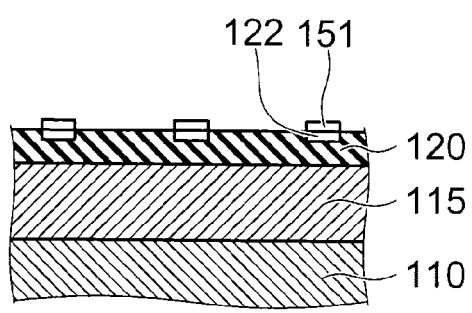

For example, a precursor 146 that reacts with the hydrophilic region 122 of the surface of the Si oxide film is supplied onto the Si oxide film 120 (FIG. 16D). Specific examples of the precursor are described later. Next, the hydrophilic region 122 (the portion that was exposed to oxygen plasma) of the surface of the Si oxide film and the precursor 146 are reacted together; thus, the film 151 having the second surface energy is formed on the Si oxide film 120. Then, the unreacted precursor 146 is removed (FIG. 16F).

As described above, an acid cross-linkable resin can also react with the hydrophilic region of the Si oxide film and can be fixed t to the surface.

Figure 17A:
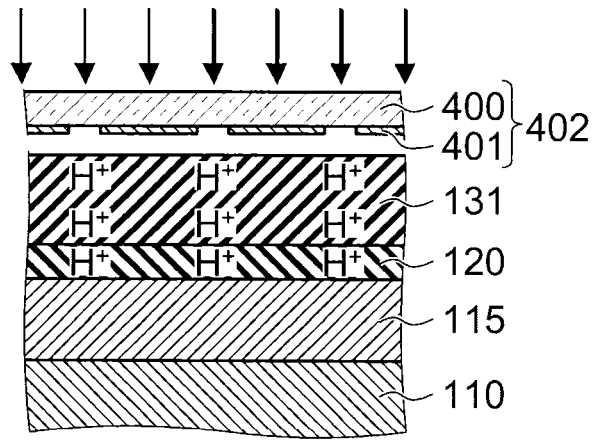
FIG. 17A to FIG. 17C are schematic cross-sectional views illustrating a pattern formation method according to the embodiment.
Figure 17B:
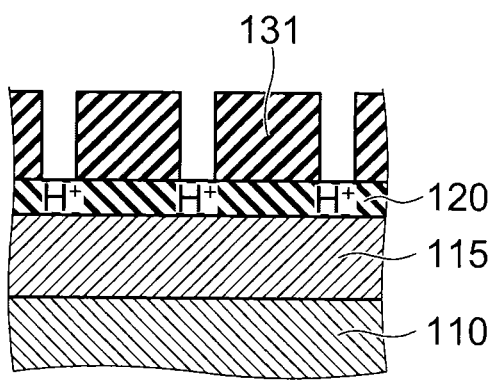
Figure 17C:
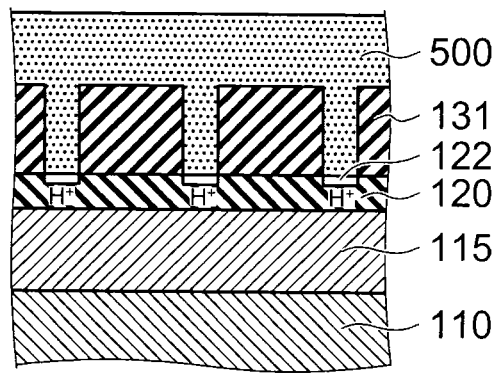

FIG. 17A to FIG. 17C are schematic cross-sectional views illustrating a pattern formation method according to the embodiment.

First, a photoacid generator is added to an SOG. Next, the SOG with the added photoacid generator is supplied onto the C film 115 to form the Si oxide film 120 on the C film 115. Next, the resist 131 is formed on the Si oxide film 120. Next, the mask 402 is placed on/above the resist 131. When the resist 131 is exposed to light using the mask 402, an acid is generated from a photoacid generator in the resist and an acid is generated also from the photoacid generator in the Si oxide film (FIG. 17A).

In the case where the resist 131 is a positive type, after resist development, acid exists in the Si oxide film in the space region of the patterned resist 131 (FIG. 17B). Next, the Si oxide film 120 without the resist 131 is exposed to oxygen plasma 500, and thereby the surface of the Si oxide film becomes hydrophilic (FIG. 17C). The processes thereafter are similar to FIG. 13C and the subsequent drawings.

In this case, for the resin included in the precursor of the acid cross-linked resin, a material that reacts with the hydroxyl group at the surface of the Si oxide film is selected. As the resin, an alkoxyurea, an alkoxymelamine, an alkoxy-benzoguanamine, an isocyanate, a urea resin, a melamine resin, a benzoguanamine resin, and an oxazoline-containing resin may be used.

Herein the acid cross-linked film is formed in a state where the resist pattern is left. Instead, the acid cross-linked film may be formed after the resist pattern is removed.

The second surface energy layer may also be formed by using a substance that selectively reacts with the hydroxyl group at the surface after making parts of the surface of the Si oxide film 120 hydrophilic, and forming hydroxyl groups at the surface and then as shown in FIG. 16C.

For example, similarly to what is described in the first example, an hydroxyl group is bonded to an end of a homo-polymer or a random copolymer that adjusts the surface energy, and the hydroxyl group is reacted with the hydroxyl group at the surface of Si or the Si oxide film; thus, the second surface energy layer can be formed. PS, PMMA, polydimethylsilane (PDMS), poly(hydroxyethyl methacrylate), and poly(hydroxyethyl acrylate) may be used as units of the random copolymer. Homo-polymer is composed of one of them or a random copolymer is composed of two or more of them.

As another example, hydroxyl groups formed at the surface in the manner of FIG. 16C and alkoxy groups or chlorine groups of a silane coupling agent may be reacted together to form a self-assembled monolayer (SAM) (FIG. 10).

The silane coupling agent has a structure of R—Si—X. X at one end is at least one of an alkoxy group and a Cl group, and easily reacts with the hydroxyl group at the surface of the Si oxide film. R at the other end is an organic group. Since R is an organic group, the surface energy can be adjusted by the SAM formed using the silane coupling agent. The organic group includes at least one of an epoxy group, an amino group, a mercapto group, a methacrylic group, a vinyl group, a benzophenone group, and an azido group. The surface energy can be adjusted by adjusting the number of carbon atoms of the organic group contained in R.

As the silane coupling agent, other than methyldisilazane and a Ph-R—SiCl$_3$ described above, a silane coupling agent in which one end is a Cl group and the other end is an organic group may be used. For example, those including an organic group of a linear hydrocarbon having 4 or more carbon atoms such as n-butyltrichlorosilane and n-octadecyltrichlorosilane, those including a hydrocarbon having a side chain such as isopropyltrichlorosilane, and those including an organic group of a phenyl group or an anthracene group such as a Ph-R—SiCl$_3$ may be used. Also a monochlorosilane or a dichlorosilane having 1 or 2 Cl groups may be used. The end may be an alkoxy group such as a methoxy group or an ethoxy group in place of a Cl group. The surface energy can be adjusted by the organic group R of the silane coupling agent.

The silane coupling agent may be reacted with a resin by being provided with a reactive group at the end of the organic group R. For example, the case where an epoxy group, an amino group, a mercapto group, a benzophenone group, an azide group, a methacryloxy group, or the like exists at the end of the organic group R is given.

These groups can react with a reactive group in a resin by energy beam irradiation or heating to fix the resin to the surface of the silane coupling agent. As the energy beam, visible light, ultraviolet light, vacuum ultraviolet light, extreme ultraviolet light, an electron beam, and an ion beam may be used. The energy line is selected from them based on the type of reaction.

In the case where the end of the organic group is an epoxy group, the epoxy group can react with a resin containing an amine or a carboxylic acid, the ring of the epoxy group is opened and cross-linked with the resin. As a result, the resin is fixed to the surface of the silane coupling agent. The epoxy group will react with a urea resin, a melamine resin, a benzoguanamine resin, a urethane resin, polyvinylamine, polyallylamine, polyethylenimine, a polymercaptan, and a polyphenol. The surface energy can be adjusted using one of these resins singly or a random copolymer containing two or more of these resins.

In the case where the end of the organic group is an amino group, the amino group can be reacted with a polyester resin, an acrylic resin, a methacrylic resin, a polyvinyl alcohol derivative, a polyvinyl acetal derivative, poly(ethylene oxide), poly(glycidyl methacrylate), poly(glycidyl acrylate), and a cycloaliphatic acrylic polymer containing an epoxy group. The surface energy can be adjusted using one of these resins singly or a random copolymer containing two or more of these resins.

In the case where the end of the organic group is a mercapto group, the mercapto group will react with a thiol having an R—SH structure to form an S—S bond.

In the case when the end of the organic group is a methacryloxy resin, the methacryloxy resin can be react with an unsaturated hydrocarbon group of a polyolefin resin to cause graft polymerization, and similarly the resin can be fixed.

In the case where the end of the organic group is a benzophenone group, the benzophenone group will react with a polymer having an alkyl group by light irradiation, particularly ultraviolet irradiation. In particular, a tertiary carbon of an alkyl group is likely to react. Therefore, the benzophenone group of the silane coupling agent reacts with the alkyl group of the polymer to fix the polymer to the benzophenone group. Furthermore, an azide group will similarly react with an alkyl group of a polymer by heating. Therefore, the azide group of the silane coupling agent reacts with the polymer, which make the polymer to be fixed to the azide group.

The second surface energy layer using a silane coupling agent can be formed by processes like the following.

FIG. 18A to FIG. 18E are schematic cross-sectional views illustrating a pattern formation method according to the embodiment.

Figure 18A:
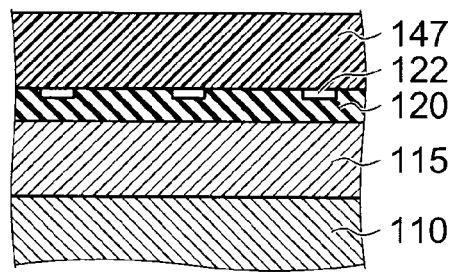
FIG. 18A to FIG. 18E are schematic cross-sectional views illustrating a pattern formation method according to the embodiment.
Figure 18D:
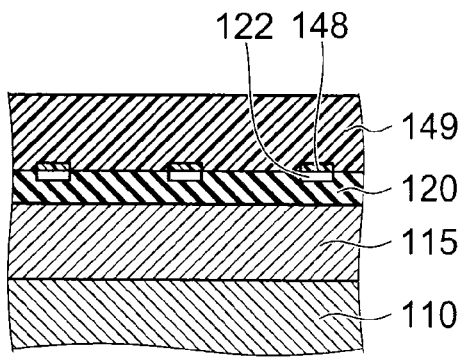
Figure 18B:
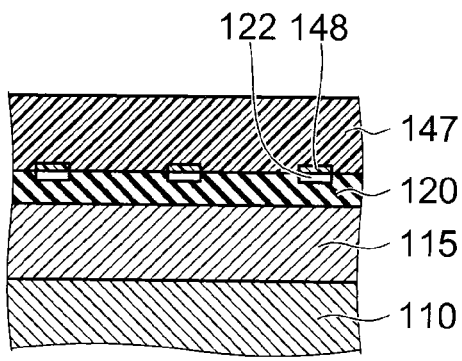

A silane coupling agent 147 is supplied onto the Si oxide film 120 in which the hydrophilic region 122 is formed (FIG. 18A), and is reacted with hydroxyl groups at the surface (FIG. 18B). Thereby, a reactive film 148 is formed on the hydrophilic region 122. When the rate of the reaction between the hydroxyl group at the surface and the silane coupling agent is high, the reaction proceeds at room temperature, but heating may be performed in order to increase the reaction rate. As the method for supplying the silane coupling agent, a liquid film may be formed by spin coating, or by coating methods other than spin coating. Furthermore, the silane coupling agent may be supplied by immersion in a chemical liquid bath.

Figure 18E:
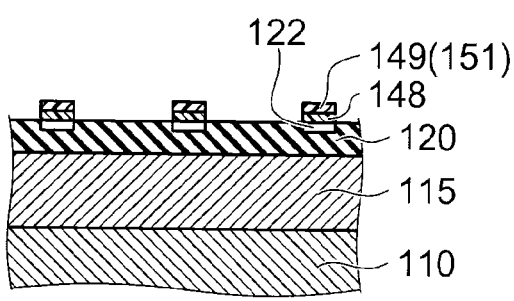
Figure 18C:
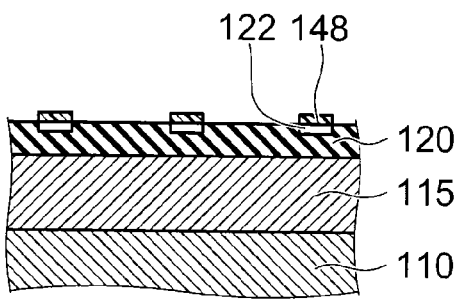

After that, the unreacted silane coupling agent is removed by a rinse (FIG. 18C). Next, the resin 149 mentioned above is supplied to the surface of the silane coupling agent fixed to the surface of the Si oxide film. Also in this case, a liquid film may be formed by spin coating or by coating methods other than spin coating. Furthermore, the silane coupling agent may be supplied by immersion in a chemical liquid bath.

Next, heating or ultraviolet irradiation is performed to react the reactive film 148 and the resin 149 together; thus, the resin 149 becomes the film 151 having the second surface energy formed only in the region made hydrophilic by oxygen plasma treatment (FIG. 18D, 18E).

When the rate of the reaction between the hydroxyl group on the surface of the Si oxide film 120 and the resin is low, a solution in which the silane coupling agent and the resin are mixed may be prepared, and the solution may be supplied to the surface of the Si oxide film. The solution is on the surface of the Si film for a while until the silane coupling agent reacts with the hydroxyl group at the surface of the Si oxide film. After the reaction, heating or ultraviolet irradiation may be performed to react the reactive group at the end of the silane coupling agent and the resin together, and the second surface energy layer may be formed only in the region made hydrophilic by oxygen plasma treatment.

Hereinabove, embodiments of the invention are described with reference to specific examples. However, the invention is not limited to these specific examples. For example, one skilled in the art may appropriately select specific configurations of components used in pattern formation methods such as various layers, films, solids, liquids, and gases from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all pattern formation methods that can be obtained by an appropriate design modification by one skilled in the art based on the pattern formation methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
    forming an organic film on a film to be processed;
    forming a layer having a first surface energy and comprising a silicon compound on the organic film;
    forming a pattern, which has a second surface energy different from the first surface energy, on the layer using a photosensitive material pattern formed by light;
    forming a block polymer on the layer and the pattern;
    forming a structure selected from the group consisting of a lamellar structure and a cylindrical structure of the block polymer comprising a plural kinds of polymers arranged by microphase separation;
    removing a part of blocks of the block polymer after the microphase separation;
    etching the layer using a remaining block of the block polymer as a mask;
    etching the organic film using the layer as a mask; and
    etching the film to be processed using the organic film as a mask to form a pattern composed of the film to be processed,
    wherein
    a stacked structure of the layer and the organic film forms an anti-reflective film used in light exposure,
    the second surface energy is not less than a maximum value of surface energies of the polymers contained by the block polymer or not more than a minimum value of the surface energies of the polymers contained by the block polymer,
    the lamellar structure is oriented perpendicularly to a layer surface on the layer, and
    the cylindrical structure is oriented so as to have an axis parallel to a normal line of the layer surface on the layer.

2. The method according to claim 1, wherein the pattern having the second surface energy is a photosensitive material pattern formed by light.

3. The method according to claim 1, wherein
    the layer is a spin-on glass,
    source materials of the spin-on-glass are at least one of an organic alkoxysilane comprising at least one structure of $Si(OR_b)_4$, $R_aSi(OR_b)_3$, $R_{a2}Si(OR_b)_2$, and $R_{a3}SiOR_b$ and an alkylchlorosilane comprising at least one structure of $RSiCl_3$, $R_2SiCl_2$, and $R_3SiCl$,
    where
        $R_a$ is at least one of a methyl group, an ethyl group, a propyl group, a butyl group, and a phenyl group,
        $R_b$ is at least one of methyl, ethyl, propyl, and phenyl, and
        R is a methyl group, an ethyl group, a propyl group, a butyl group, or a phenyl group, and
    the spin-on glass is synthesized by hydrolysis and dehydration condensation.

4. The method according to claim 1, wherein
    the layer is an oxide film formed by chemical vapor deposition,
    a source gas of the chemical vapor deposition comprises at least one of a tetraalkoxysilane, an alkylalkoxysilane, an alkylchlorosilane, and an alkylcyclosiloxane,
    an alkyl group of the alkylalkoxysilane, the alkylchlorosilane, and the alkylcyclosiloxane is at least one of a methyl group, an ethyl group, a propyl group, a butyl group, and a phenyl group, and
    an alkoxy group of the tetraalkoxysilane and the alkylalkoxysilane is at least one of a methoxy group, an ethoxy group, a propoxy group, a butoxy group, and a phenoxy group.

5. The method according to claim 4, wherein the source gas comprises oxygen.

6. The method according to claim 4, wherein during film-formation of the oxide film by the chemical vapor deposition,
    the alkoxysilane and oxygen are used as the source gas at a first stage of the film-formation, and
    at least one of the alkylalkoxysilane, the alkylchlorosilane, and the alkylcyclosiloxane is added during the film-formation.

7. A pattern formation method comprising:
forming a pattern on a layer;
forming a block polymer on the layer and the pattern; and
forming a structure selected from the group consisting of a lamellar structure and a cylindrical structure of the block polymer containing a plural kinds of polymers arranged by microphase separation,
wherein
the layer has a first surface energy and comprises a silicon compound,
the pattern has a second surface energy different from the first surface energy,
the second surface energy is not less than a maximum value of surface energies of the polymers contained by the block polymer or not more than a minimum value of the surface energies of the polymers contained by the block polymer,
the lamellar structure is oriented perpendicularly to the layer surface on the layer,
the cylindrical structure is oriented so as to have an axis parallel to a normal line of the layer surface on the layer, and
formation of the pattern having the second surface energy comprises:
forming a resist pattern on the layer using a resist;
forming a precursor of the pattern on the resist pattern and the layer;
reacting the precursor on a surface of the layer which is not covered with the resist;
removing unreacted precursor; and
removing the resist pattern.

8. The method according to claim 7, wherein
a photoacid generator is added to the layer,
the precursor of the pattern comprises:
at least one of resins capable of a cross-linking reaction catalyzed by an acid, or
at least one of cross-linkers capable of a cross-linking reaction catalyzed by an acid, or
at least one of resins and at least one of cross-linkers capable of a cross-linking reaction catalyzed by an acid; and
a solvent dissolving at least one of the resins and the cross-linkers,
the resist is positive-tone,
an acid is generated from the photoacid generator in the layer by irradiating a pattern area corresponding to a space region of the resist pattern with light in light exposure, and
the pattern is formed by cross-linking at least one of the resins and the cross-linkers catalyzed by the acid on the layer by heating.

9. The method according to claim 8, wherein
at least one of the resins, or
at least one of the cross-linkers, or
at least one of the resins and at least one of the cross-linkers comprises at least one of an alkoxyurea, an alkoxymelamine, an alkoxybenzoguanamine, an isocyanate, a urea resin, a melamine resin, a benzoguanamine resin, and an oxazoline-containing resin, or
comprises
at least one of an alkoxyurea, an alkoxymelamine, an alkoxybenzoguanamine, an isocyanate, a urea resin, a melamine resin, a benzoguanamine resin, and an oxazoline-comprising resin; and
at least one of a carboxylic anhydride, acrylic acid, methacrylic acid, an isocyanate, poly(glycidyl methacrylate), poly(glycidyl acrylate), a polyester resin, an acrylic resin, a methacrylic resin, a polyvinyl alcohol derivative, a polyvinyl acetal derivative, poly(ethylene oxide), and a cycloaliphatic acrylic polymer comprising an epoxy group.

10. The method according to claim 8, wherein
at least one of the resins, or
at least one of the cross-linkers, or
at least one of the resins and at least one of the cross-linkers comprises
an epoxy resin; and
at least one of urea, ethyleneurea, benzoguanamine, melamine, glycoluril, an isocyanate, (diethylenetriamine, triethylenetetramine, m-phenylenediamine, methylenedianiline, a carboxylic anhydride, acrylic acid, methacrylic acid, a ketimine, a urea resin, a melamine resin, a benzoguanamine resin, a urethane resin, polyvinylamine, polyallylamine, polyethylenimine, a polyester resin, a polymercaptan, and a polyphenol.

11. The method according to claim 8, wherein the solvent comprises at least one of water, an alcohol, and a propylene glycol derivative.

12. The method according to claim 7, wherein the precursor comprises a silane coupling agent or a polymer comprising a hydroxyl group at an end.

13. The method according to claim 7, wherein the layer which is not covered with the resist is exposed to an oxygen plasma after the resist pattern is formed.

14. The method according to claim 7, wherein
the formation of the pattern having the second surface energy comprises:
forming the resist pattern on the layer;
exposing the layer which is not covered with the resist to oxygen plasma;
removing the resist pattern;
supplying a precursor of the pattern onto the layer;
reacting the precursor and portion of the layer exposed to the oxygen plasma; and
removing the unreacted precursor.

15. The method according to claim 14, wherein the precursor comprises a silane coupling agent or a polymer comprising a hydroxyl group at an end.

16. The method according to claim 15, wherein the silane coupling agent comprises:
at least one of an alkoxy group and a chlorine group; and
at least one of an epoxy group, an amino group, a mercapto group, a methacryloxy group, a benzophenone group, and an azide group.

17. The method according to claim 7, further comprising:
removing a part of blocks of the block polymer after microphase separation,
etching the layer using a remaining block of the block polymer as a mask, thereby obtaining an etched layer; and
etching a film to be processed, which is provided under the layer, using the etched layer as a mask to form a pattern composed of the film to be processed.

* * * * *